(12) United States Patent
Kanemaru et al.

(10) Patent No.: US 8,502,081 B2
(45) Date of Patent: Aug. 6, 2013

(54) ASSEMBLY SUBSTRATE AND METHOD OF MANUFACTURING THE SAME

(75) Inventors: Yoshikazu Kanemaru, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 886 days.

(21) Appl. No.: 12/219,372

(22) Filed: Jul. 21, 2008

(65) Prior Publication Data
US 2009/0025965 A1    Jan. 29, 2009

(30) Foreign Application Priority Data
Jul. 25, 2007    (JP) ................. 2007-193844

(51) Int. Cl.
*H05K 1/03* (2006.01)
*H05K 7/02* (2006.01)
*H05K 7/04* (2006.01)

(52) U.S. Cl.
USPC ........................................ 174/255; 361/810

(58) Field of Classification Search
USPC .................. 174/255, 260; 361/796, 813, 805, 361/807, 810, 829; 257/676
See application file for complete search history.

(56) References Cited

U.S. PATENT DOCUMENTS

| | | | | |
|---|---|---|---|---|
| 6,118,183 A * | 9/2000 | Umehara et al. | ............. | 257/783 |
| 6,369,440 B1 * | 4/2002 | Kobayashi | .................... | 257/676 |
| 7,235,423 B1 * | 6/2007 | Wang et al. | .................... | 438/107 |
| 2003/0000723 A1 | 1/2003 | Singh | | |
| 2005/0212129 A1 * | 9/2005 | Huang et al. | .................. | 257/676 |
| 2006/0156540 A1 * | 7/2006 | Cromwell et al. | ............ | 174/260 |

FOREIGN PATENT DOCUMENTS

| | | |
|---|---|---|
| JP | A-2000-216518 | 8/2000 |
| JP | A-2000-228566 | 8/2000 |
| JP | A-2005-167141 | 6/2005 |
| JP | A-2005-217099 | 8/2005 |
| JP | A-2007-019123 | 1/2007 |

OTHER PUBLICATIONS

Sep. 22, 2010 Search Report issued in European Patent Application No. 08013359.8.

* cited by examiner

*Primary Examiner* — Timothy Thompson
*Assistant Examiner* — Roshn Varghese
(74) *Attorney, Agent, or Firm* — Oliff & Berridge, PLC

(57) ABSTRACT

The object of the present invention is to provide an assembly substrate which is easily handled and capable of suppressing occurrence of warpage, and offers high productivity and economic efficiency, and its manufacturing method. A work board 100 includes an insulating layer 21 on one surface of a substantially rectangular-shaped substrate 11, and electronic components 41 and a plate-like integrated frame 51 are embedded inside the insulating layer 21. The plate-like integrated frame 51 has a plurality of concave portions 53 arranged in parallel at its inner periphery wall 52a, and arranged on a non-placing area of the electronic components 41 so as to surround a plurality of the electronic components 41 (groups).

5 Claims, 29 Drawing Sheets

ASSEMBLY SUBSTRATE AND METHOD OF MANUFACTURING THE SAME

BACKGROUND OF THE INVENTION

1. Field of the Invention

The present invention relates to an assembly substrate which contains a plurality of individual substrates in its surface direction, and its manufacturing method.

2. Description of the Related Art

In recent years, with the progress of electronics technology, there has been a growing demand towards higher density in printed circuit boards. As such, multilayer printed circuit boards in which are laminated pluralities of wiring patterns and insulating layers are becoming widely used.

Conventionally, for the purpose of increasing productivity, printed circuit boards used in these types of applications are manufactured in a "multiple dice from one substrate" manner in which, for example, an approximately 300 mm to 500 mm square worksheet (assembly substrate) provided with a plurality of wiring pattern groups (wiring layers) for printed circuit boards is separated into individual dice by dicing or the like to obtain a plurality of printed circuit boards (individual substrates, dice, or bodies). Multi-layering of the worksheet is normally achieved by alternately building up wiring patterns and insulating layers. Then, generally, a wiring pattern or the like is formed using a subtractive method or an additive method while an insulating layer is formed by thermal curing of a thermosetting resin.

With the conventional worksheet manufacturing method described above, warpage of a worksheet inevitably occurs due to stress applied during the formation of the insulation layers. Therefore, in order to suppress the warpage of the worksheet, for example, Japanese Patent Laid-Open No. 2005-167141 proposes a manufacturing method for obtaining a plurality of individual substrates on which a plurality of wiring pattern groups (wiring layers) for printed circuit boards as well as a frame-like conductive pattern that is discontinuous with slits formed thereon and surrounds the plurality of wiring patterns are provided on a worksheet, and after processes such as build-up and surface-mounting, the worksheet is separated so as to remove the frame-like conductive pattern.

[Patent Document 1] Japanese Patent Application Laid-Open No. 2005-167141

In recent years, for the purpose of improving manufacturing efficiency, a method under consideration for producing a plurality of individual substrates involves producing a large work board serving as an assembly substrate that contains a plurality of worksheets, separating the work board by a dicer or the like to produce a plurality of small worksheets, and further separating the resultant worksheets.

When the above-mentioned conventional manufacturing method is applied to the production of such work boards, since a frame-like conductive pattern is provided discontinuously, resultant work boards may have poor substrate strength in a portion not provided with frame-like conductive patterns, resulting in handling difficulty at the time of manufacturing/processing including transferring and separating as well as insufficient suppression of warpage. It is expected that these problems will be significant further as the work board becomes thinner and has a larger area.

On the other hand, with the frame-like conductive pattern removed, each of the worksheets obtained by separating the work board will have significantly lower substrate strength in comparison to the work board, resulting in handling difficulty and warpage which is not suppressed at all. As a result, inconveniences such as transfer failures and degraded positional accuracy at the time of build-up and surface mounting may occur. Therefore, when the above-mentioned conventional manufacturing method is applied to the production of a work board, not only reduction of productivity and economic efficiency, such as a decline in process yield, but also a decline in the mounting reliability will occur.

SUMMARY OF THE INVENTION

Therefore, the present invention has been made in view of such circumstances, and its object is to provide an assembly substrate which is easily handled and capable of suppressing occurrence of warpage, and contains a plurality of individual substrates in its surface direction, and a manufacturing method by which such an assembly substrate can be manufactured at a low cost and in a simple manner without requiring complicated steps, and which offers high productivity and economic efficiency.

In order to solve the above-mentioned problems, the assembly substrate according to the present invention is a substrate in which a plurality of individual substrates are contained in its surface direction, includes: a substrate; wiring layers formed in correspondence to the individual substrates respectively; and a frame body which is arranged, with respect to a plurality of assembly bodies containing at least one or more of the individual substrates, so as to surround the outer periphery of the respective assembly bodies, and which has a plurality of concave portions arranged in parallel along its inner periphery.

In addition, in the present specification, "an assembly substrate which contains a plurality of individual substrates in its surface direction" indicates an assembly substrate (a work board) in which a plurality of the above-mentioned individual substrates (dice, bodies) are formed in its surface direction. Moreover, "an assembly body which contains at least one or more individual substrates" indicates a collection of at least one or more individual substrates among a plurality of the individual substrates contained in the assembly substrate, and also stands for a so called worksheet. This work board may have electronic components mounted thereon, each represented by an active element such as a semiconductor IC, and a passive element such as a varistor, a resistor, or a capacitor. These electronic components may be mounted on the surface of a substrate, may be embedded inside the substrate, or may be embedded inside the substrate and only a part of them is exposed, for example, a wiring structure such as a terminal for electric connection may be partially exposed outside.

Moreover, in the present specification, "wiring layer" may be formed at least one or more places of the substrate surface, the substrate rear-surface, and the inside of the substrate.

Further, in the present specification, a "frame body" may be formed in an integral manner or may be a frame body on which a plurality of members formed separately is connected in a shape of an integral frame, substantially with no gap. Moreover, the "frame body" may be directly mounted on the substrate surface or the substrate rear-surface, or may be arranged inside the substrate.

In the above-mentioned configuration, since the frame body is arranged so as to surround the outer periphery of each of the assembly bodies, the substrate strength is enhanced substantially isotropically without extreme local difference (that is, without directional anisotropy). In other words, the frame body serves as a structure for improving the mechanical strength of the assembly substrate, substantially isotropically, and suppresses the shape deformation of the substrate against the imparted stress. Therefore, since having suppressed warpage and improved substrate strength, for this assembly substrate, handling at the time of manufacturing/processing such as transferring and separating (cutting) will be facilitated and occurrence of warpage is suppressed effectively, resulting in enhancement of productivity and economic efficiency, and improvement of mounting reliability of obtained individual substrates is achieved.

Moreover, in the above-mentioned configuration, since a frame body is used in which a plurality of concave portions are arranged in parallel along its inner periphery, when the assembly substrate is separated on a line crossing (traversing) each of the concave portions of this frame body (that is, using a plane along the line as a separating plane), a substrate piece (worksheet or individual substrate) on which the cut pieces (separated pieces) of the frame body are present at its outer periphery (outer edge) in a shape of a frame can be produced. This enables the substrate piece (worksheet or individual substrate) on which a frame-like member is mounted at its outer periphery (outer edge) to be easily obtained from an assembly substrate (work board) on which the frame-like member is arranged, which cannot be achieved conventionally. As a result, the substrate strength of the obtained substrate piece (worksheet or individual substrate) can be sufficiently maintained, and occurrence of warpage is suppressed efficiently. Therefore, since, for the obtained substrate piece (worksheet or individual substrate), handling at the time of manufacturing/processing such as transferring, separating (cutting), build-up, and surface mounting, will be facilitated, and as a result, occurrence of subsequent manufacturing/processing troubles are suppressed and yield is improved, productivity and economic efficiency are enhanced, and improvement of mounting reliability of obtained individual substrates is achieved.

Moreover, since separating the assembly substrate as mentioned above in the separating plane allows the substantial separating area to be reduced to an extent equivalent to the respective concave portions, separating will be facilitated and the lifetime of a separating tool can be extended by, for example, reduction of load on the edge of a dicer.

More specifically, the frame body is a lattice frame with a plurality of windows, that is, a lattice frame in which a plurality of windows are defined by lattices provided inside an outer frame, and it is preferable for the inner periphery of the windows (a lattice and an outer frame defining each of the windows) to have a plurality of concave portions. When such a lattice frame is used as a frame body, the lattice acts as a so called beam for reinforcing the outer frame, thereby, the substrate strength will be enhanced isotropically further, handling at the time of manufacturing/processing such as transferring and separating will be extremely easy, and occurrence of warpage will be suppressed more effectively. Moreover, since, when the assembly substrate is separated on a line crossing each of the concave portions of this frame body, substrate pieces (worksheets or individual substrates) on which cut pieces of the frame body are present at the outer periphery (outer edge) so as to correspond to each of the windows, can be produced, productivity can be enhanced.

Moreover, it is preferable to have a structure in which the concave portion spreads inwardly from its opening continuously (gradually) or stepwise. Since forming the concave portions in this manner and separating the assembly substrate on a line so as to cross the wider portions of the concave portions (a portion wider than the opening) allow the substantial separating area of the frame body to be further reduced, a load on the separating tool will be reduced further. Accordingly, separating can be facilitated, and the lifetime of a separating tool can be further extended. Moreover, since the exposed area of a frame body exposed to the outer periphery wall (separating plane) of the obtained substrate piece (worksheet or individual substrate) can be made small, peeling (releasing) of a membrane which may occur at this outer periphery wall, is suppressed.

Further, it is preferable that the frame body has holes on a straight line connecting neighboring concave portions. Since, when holes are constituted in this manner and the assembly substrate is separated on a line so as to cross the neighboring concave portions and holes, the substantial separating area of the frame body is further reduced, the load on the separating tool will be reduced further. Accordingly, separating can be facilitated and the lifetime of a separating tool can be further extended. Moreover, since the exposed area of a frame body exposed to the outer periphery wall (separating plane) of the obtained substrate piece (worksheet or individual substrate) can be made small, peeling (releasing) of a membrane which may occur at this outer periphery wall, is suppressed.

Moreover, the manufacturing method of an assembly substrate according to the present invention is a method for manufacturing the assembly substrate according to the present invention, including steps of: preparing a substrate which has wiring layers formed in correspondence to the individual substrates respectively; and arranging, with respect to a plurality of assembly bodies containing at least one or more of the individual substrates, a frame body which has a plurality of concave portions arranged in parallel along its inner periphery, so as to surround the outer periphery of the respective assembly bodies. As mentioned above, by separating the thus obtained assembly substrate on a line crossing a plurality of the above-mentioned concave portions, substrate pieces (worksheets, or individual substrates) on which the cut pieces (separated pieces) of the frame body are present at its outer periphery (outer edge) can be produced.

According to the assembly substrate of the present invention and its manufacturing method, since the substrate strength is enhanced substantially isotropically without extreme local difference (that is, without directional anisotropy), uneven internal stress is relaxed and the substrate strength is improved further, enabling warpage of the substrate to be suppressed, and handling at the time of manufacturing/processing such as transferring and separating to be facilitated. Moreover, when the assembly substrate is separated on a line so as to cross each of the concave portions in the frame body, substrate pieces (worksheets, or individual substrates) on which cut pieces of the frame body are present in a shape of a frame at its outer periphery (outer edge) can be produced at a low cost and in a simple manner without requiring a complicated steps, while reducing the load on the separating tool. Therefore, occurrence of disadvantages at the time of transferring, separating, build-up, or surface mounting can be suppressed, enabling enhancement of productivity and economic efficiency, such as improvement of yield, and improvement of mounting reliability to be achieved.

DETAILED DESCRIPTION OF THE PREFERRED EMBODIMENTS

Figure 1:
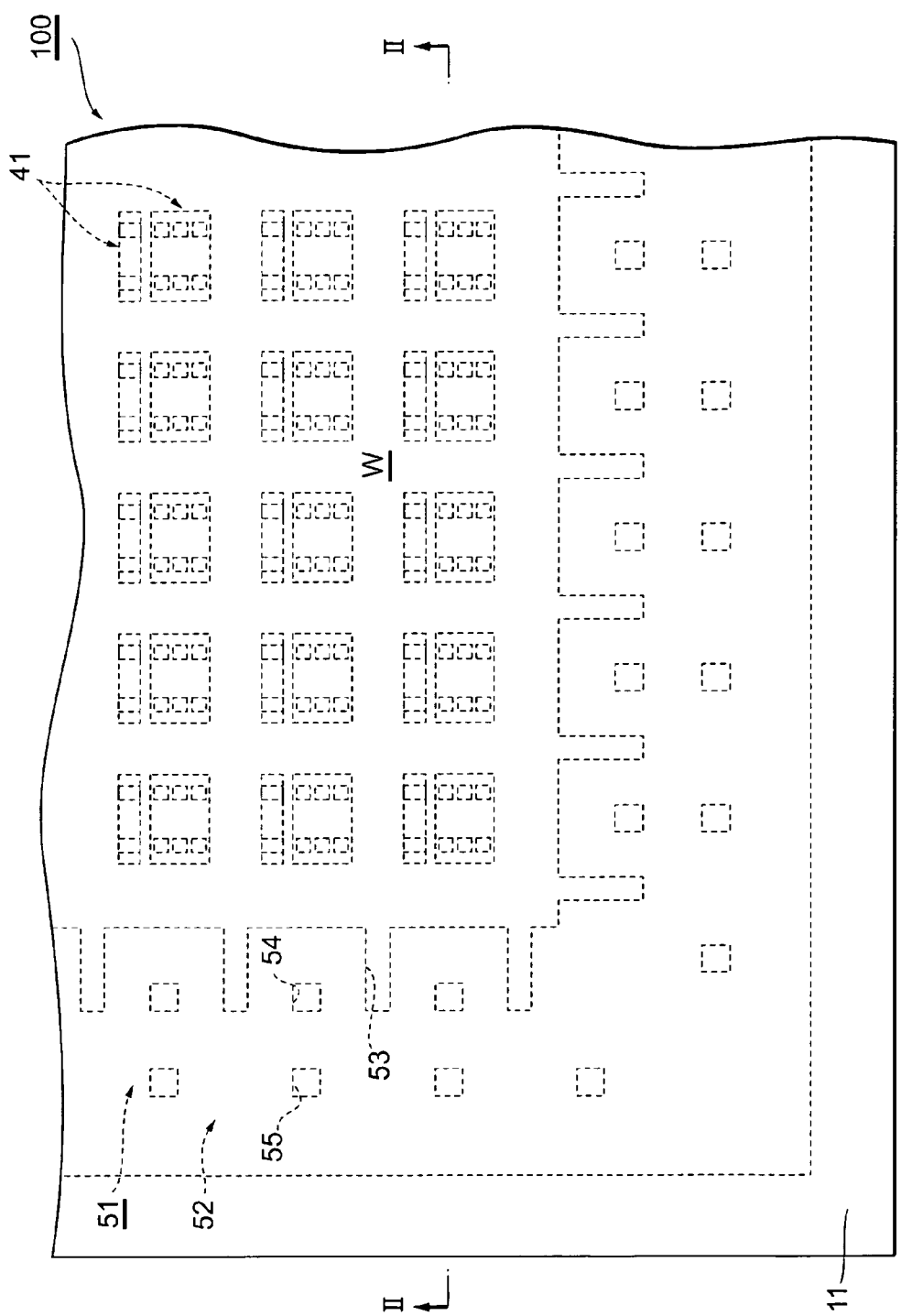
FIG. 1 is a plan view illustrating the main part of a first embodiment of the assembly substrate according to the present invention.

Hereinafter, with reference to drawings, embodiments of the present invention will be described. In addition, in the drawings, same elements are denoted by the same reference numerals, and duplicated description will be eliminated. Moreover, unless otherwise noted, it is intended that positional relationship such as up and down or right and left is based on the positional relationship illustrated in the drawings. Further, it is intended that scale in the drawings is not limited to the scale illustrated in figures.

First Embodiment

Figure 2:
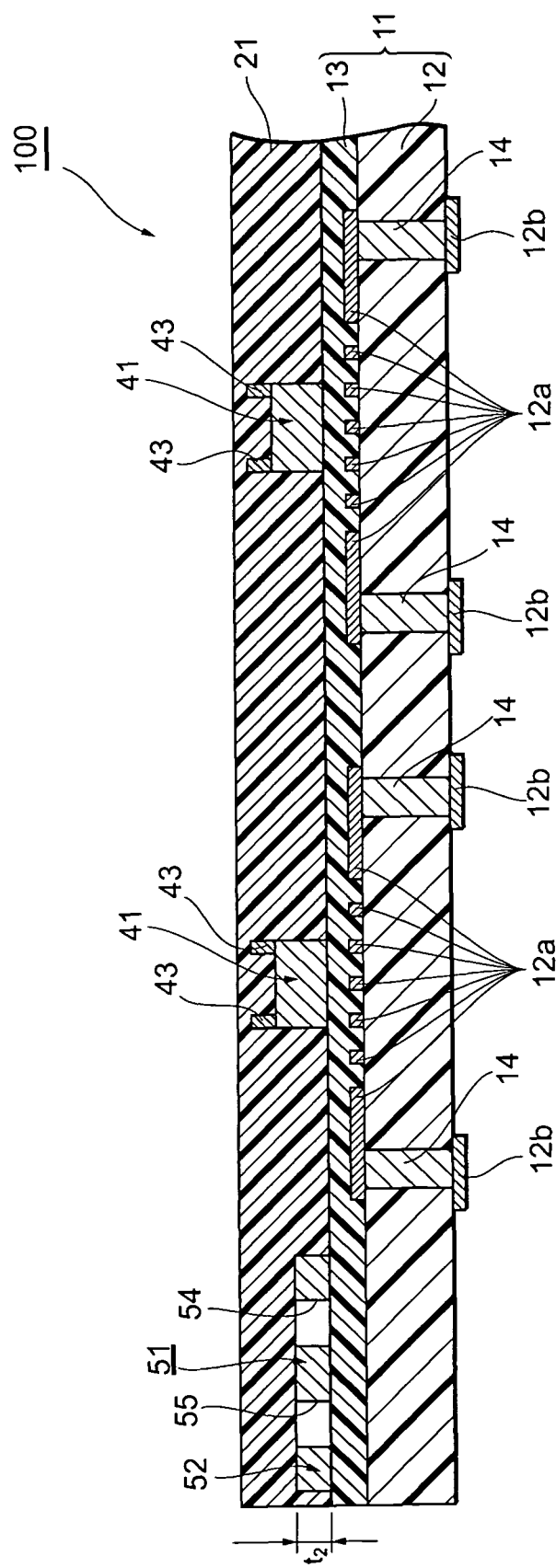
FIG. 2 is a cross-sectional view along a line II-II in FIG. 1.

FIG. 1 and FIG. 2 are a main part enlarged plan view and a main part enlarged cross-sectional view schematically illustrating the structure of a first embodiment of the assembly substrate according to the present invention, respectively. A work board 100 is an electronic component-embedded assembly substrate, which contains a plurality of worksheets (assembly bodies) capable of producing a plurality of individual substrates in the surface direction within the sheet surface, and on which an insulating layer 21 is provided on one surface (upper surface in figures) of a substantially rectangular-shaped substrate 11, and electronic components 41 and a plate-like integrated frame 51 (frame body) are embedded at predetermined positions inside the insulating layer 21.

The substrate 11 includes wiring layers (patterns) 12a and 12b formed on both faces of the insulating layer 12, and an insulating layer 13 laminated on top of the wiring layer 12a by vacuum pressure-bonding an insulating resin film on the wiring layer 12a. The wiring layers (patterns) 12a and 12b are formed so as to correspond to their target individual substrates, respectively. Moreover the wiring layers 12a and 12b are electrically connected to each of their target individual substrates through vias 14 penetrating through the insulating layer 12, respectively.

Materials used for the insulating layers 12 and 13 are not particularly limited, and any material may be used in so far as such material is moldable into sheet-form or film-form. Specific examples of materials usable for the insulating layers 12 and 13 include: simple resins such as vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+ active ester curable resin, polyphenylene ether resin (polyphenylene oxide resin), curable polyolefin resin, benzocyclobutene resin, polyimide resin, aromatic polyester resin, aromatic liquid crystal polyester resin, polyphenylene sulfide resin, polyetherimide resin, polyacrylate resin, polyether ether ketone resin, fluorine resin, epoxy resin, phenol resin and benzoxazine resin; materials obtained by adding, to these resins, silica, talc, calcium carbonate, magnesium carbonate, aluminum hydroxide, magnesium hydroxide, aluminum borate whisker, potassium titanate fibers, alumina, glass flakes, glass fibers, tantalum nitride, aluminum nitride, or the like; materials obtained by adding, to the aforementioned resins, metal oxide powder containing at least one metal selected from magnesium, silicon, titanium, zinc, calcium, strontium, zirconium, tin, neodymium, samarium, aluminum, bismuth, lead, lanthanum, lithium and tantalum; materials obtained by incorporating, into the aforementioned resins, glass fibers or resin fibers such as aramid fibers; and materials obtained by impregnating the aforementioned resins in a glass cloth, aramid fibers, nonwoven fabric, or the like. A suitable material can be selected and used as appropriate from the perspectives of electric properties, mechanical properties, water absorption, reflow resistance and the like.

The insulating layer 21 is made of a thermosetting resin. Specific resin materials that can be used, either individually or in combination thereof, include: epoxy resin, phenol resin, vinyl benzyl ether compound resin, bismaleimide triazine resin, cyanate ester resin, polyimide, polyolefin resin, polyester, polyphenylene oxide, liquid crystalline polymer, silicone resin, fluorine resin, and the like. In addition, a rubber material such as acrylic rubber and ethylene-acrylic rubber or a resin material partially including a rubber component may be used. Furthermore, usable materials include: those obtained by adding, to the aforementioned resins, silica, talc, calcium carbonate, magnesium carbonate, aluminum hydroxide, magnesium hydroxide, aluminum borate whisker, potassium titanate fibers, alumina, glass flakes, glass-fibers, tantalum nitride, aluminum nitride, or the like; materials obtained by adding, to the aforementioned resins, metal oxide powder containing at least one metal selected from magnesium, silicon, titanium, zinc, calcium, strontium, zirconium, tin, neodymium, samarium, aluminum, bismuth, lead, lanthanum, lithium and tantalum; materials obtained by incorporating, into the aforementioned resins, glass fibers or resin fibers such as aramid fibers; and materials obtained by impregnating the aforementioned resins in a glass cloth, aramid fibers, nonwoven fabric, or the like. A suitable material can be selected and used as appropriate from the perspectives of electric properties, mechanical properties, water absorption, reflow resistance and the like.

Figure 3:
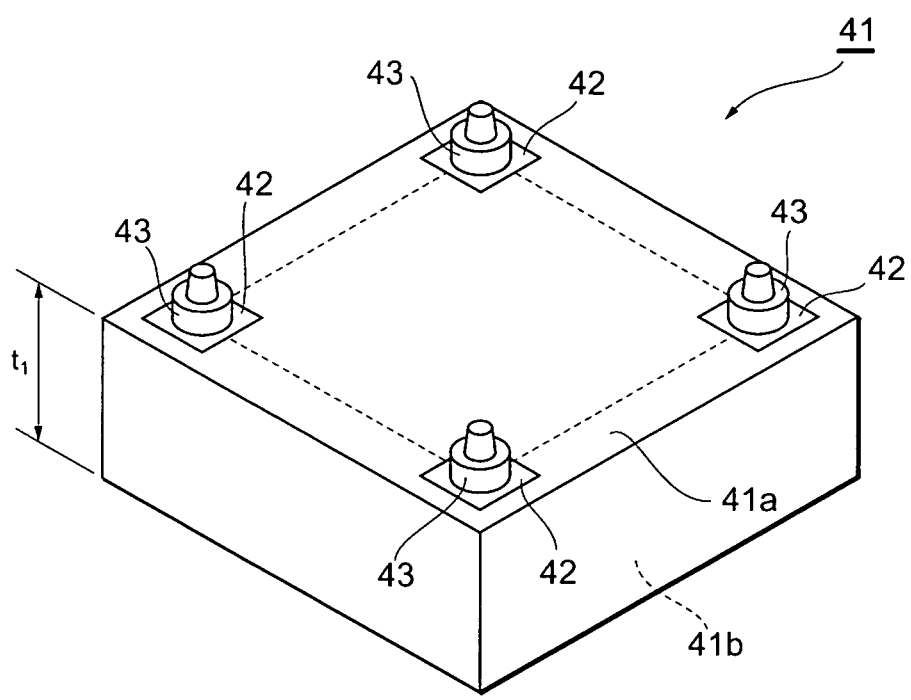
FIG. 3 is a perspective view illustrating the schematic configuration of an electronic component 41.

FIG. 3 is a perspective view schematically showing a structure of the electronic component 41. The electronic component 41 is a semiconductor IC (die) in a bare-chip state, and includes numerous land electrodes 42 on a primary surface 41a thereof having an approximately rectangular plate-shape. Note that, in the diagram, land electrodes 42 and bumps (terminals) 43, to be described hereinafter are only shown at the four corners, and other land electrodes 42 have been omitted. In addition, types of the electronic component 41 are not particularly limited and typical examples thereof include digital ICs with extremely high operating frequencies such as a CPU or a DSP.

A rear surface 41b of the electronic component 41 is polished, whereby the thickness t1 (the distance from the primary surface 41a to the rear surface 41b) of the electronic component 41 is set so as to be smaller than an ordinary semiconductor IC. More specifically, the thickness t1 of the electronic component 41 is set to, for example, 200 µm or less, preferably to 100 µm or less, and more preferably to around 20 to 50 µm. In addition, the rear surface 41b of the electronic component 41 is preferably roughened by etching, plasma treatment, laser irradiation, blasting, buffing, chemical treatment or the like in order to enhance thinning or adhesion.

Polishing of the rear surface 41b of the electronic component 41 is preferably performed collectively in the wafer state for a large number of electronic components 41, whereby the electronic components 41 are subsequently separated from each other by dicing. When dicing is performed to separate individual electronic components 41 prior to reducing thickness by polishing, the rear surface 41b can be polished in a state where the primary surface 41a of the electronic component 41 is covered by a thermosetting resin or the like.

A bump (terminal) 43 that is a type of a conductive protrusion is formed on each land electrode 42. The bump 43 is not limited to any particular type, and examples of various types of usable bumps include a stud bump, a plate bump, a plating bump, and a ball bump. Stud bumps are exemplified in the diagram. When stud bumps are used as the bumps 43, the stud bumps may be formed by wire bonding of silver (Ag) or copper (Cu), and when plate bumps are used, the plate bumps may be formed by plating, sputtering, or vapor deposition. When plating bumps are used, the bumps may be formed by plating, and when ball bumps are used, the bumps may be formed by either mounting a solder ball on the land electrode 42 and then melting the same or by printing a cream solder on the land electrode and then melting the same. Also usable are bumps having a conical shape, a cylindrical shape or the like formed by screen-printing and curing a conductive material, or bumps formed by printing a nanopaste and sintering the same by heating.

Types of metals that can be used for the bumps 43 are not particularly limited, and examples of usable metals include gold (Au), silver (Ag), copper (Cu), nickel (Ni), tin (Sn), chromium (Cr), nickel/chromium alloy, solder, and the like. Among these metals, when connectivity and migration are taken into consideration, it is preferable to use gold or copper, and more preferably, copper. By using copper as the material for the bumps 43, in comparison to a case where, for example, gold is used, a high-strength bond to the land electrodes 42 can be obtained and the reliability of the electronic component 41 itself can be enhanced.

The dimensions and shape of the bump 43 can be appropriately set according to the interval (pitch) between the land electrodes 42. For example, when the pitch of the land electrodes 42 is approximately 100 µm, setting the maximum radius of the bumps 43 to around 10 to 90 µm and the height thereof to around 2 to 100 µm shall suffice. After cutting and separation into individual electronic components 41 by wafer dicing, the bumps 43 can be bonded to the respective land electrodes 42 using wire bonder.

Figure 4:
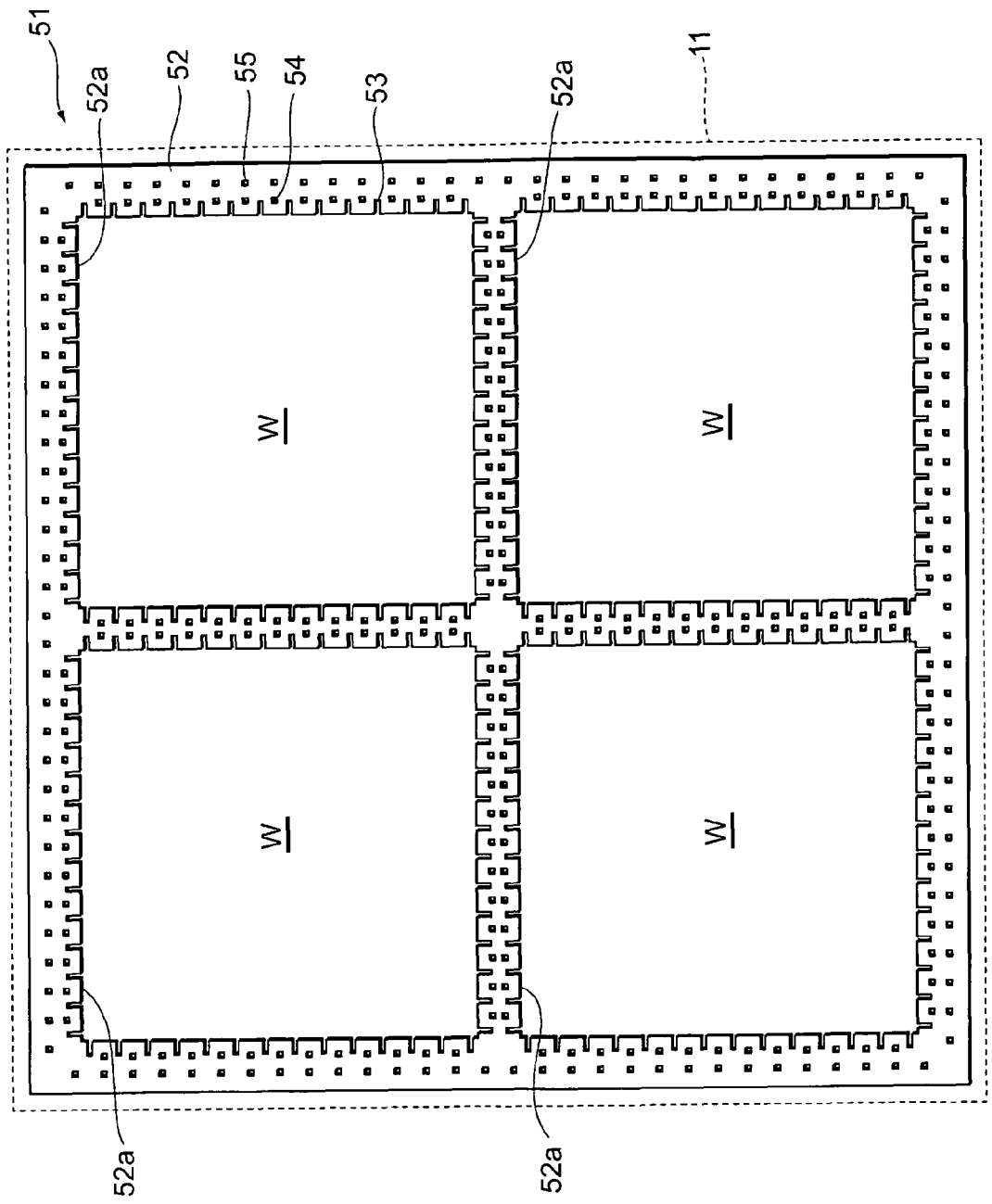
FIG. 4 is a plan view illustrating the schematic configuration of a plate-like integrated frame 51.
Figure 5:
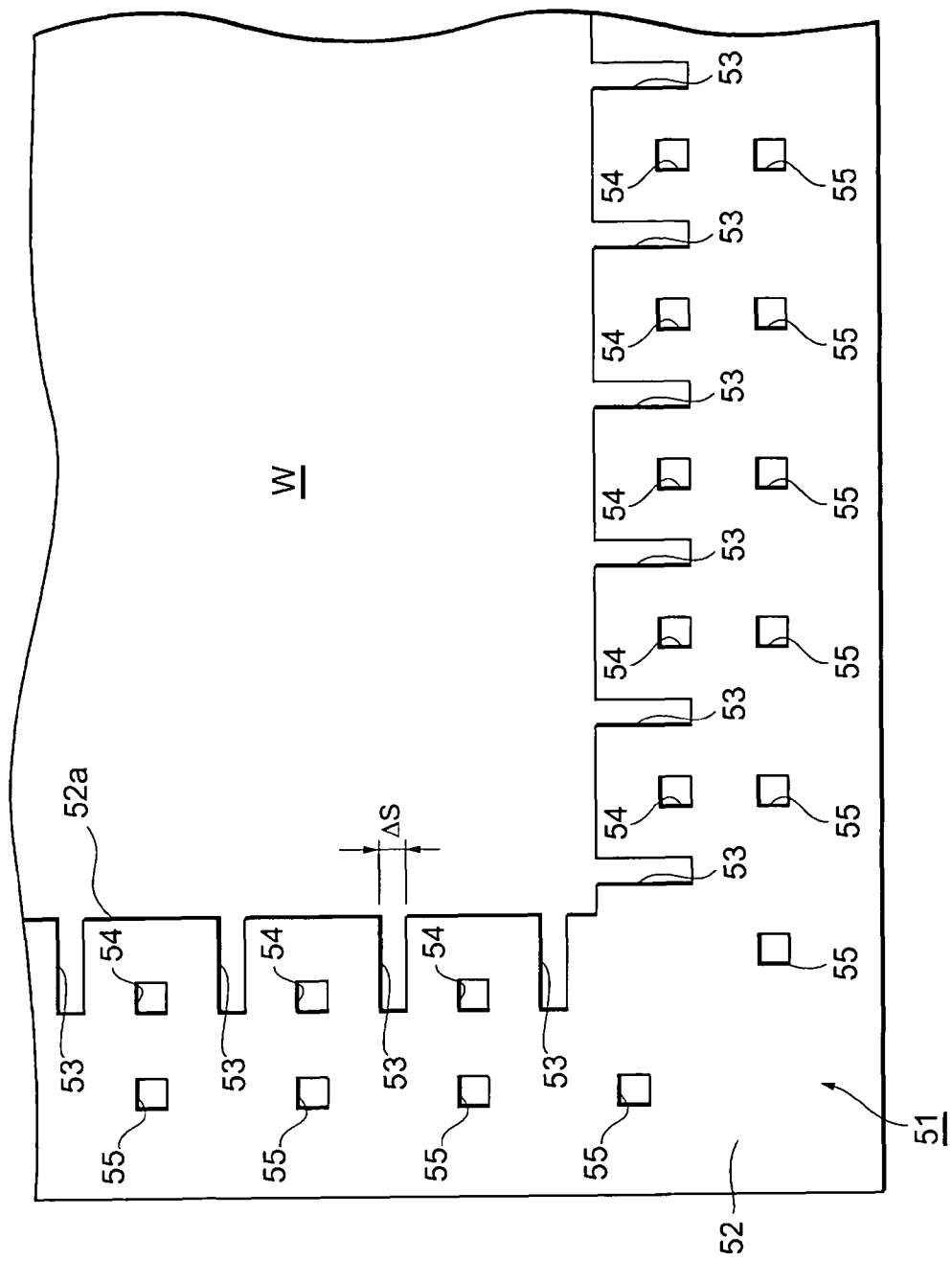
FIG. 5 is a plan view illustrating the main part of the plate-like integrated frame 51.
Figure 6:
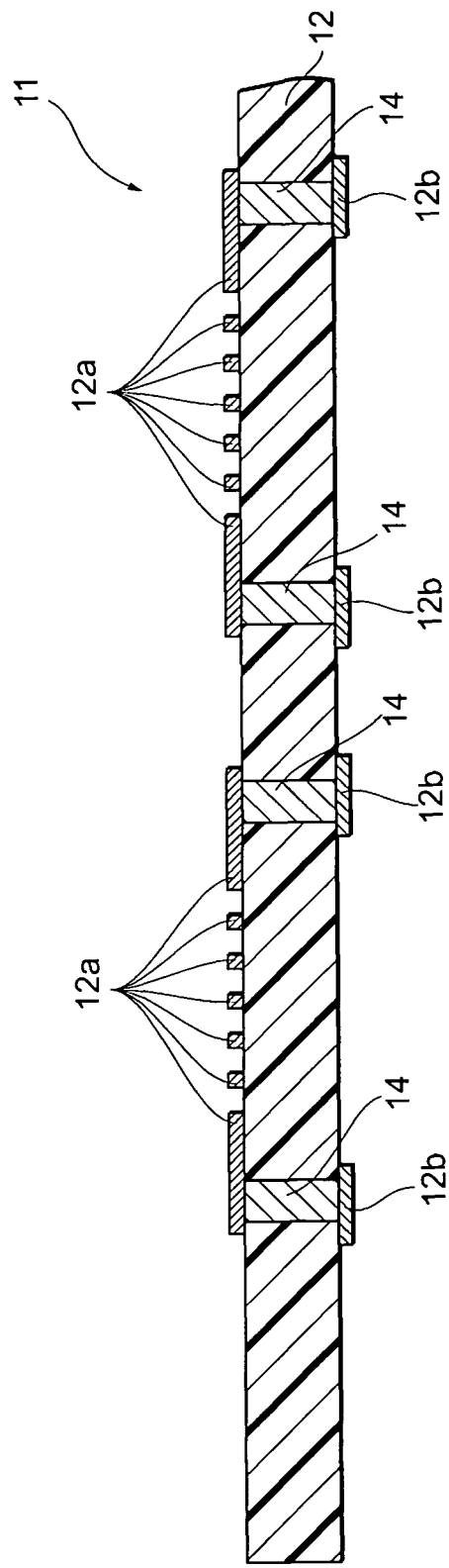
FIG. 6 is a process view illustrating an example of steps for manufacturing a work board 100.

FIG. 4 and FIG. 5 are a plan view and a main part enlarged plan view schematically illustrating the structure of the plate-like integrated frame 51, respectively. The plate-like integrated frame 51 used for the present embodiment consists of a frame portion 52 consisting of a tabular body in which four rectangular-shaped windows W are divided in a lattice. The outer shape of the frame portion 52 has a substantially rectangular-shape that is substantially similar to the outer shape of the substrate 11, and is designed to be slightly smaller than substrate 11 in its outer size. In addition, as illustrated in FIG. 1, it is preferable that the thickness t2 (thickest portion) of the frame portion 52 is slightly thinner than the thickness t1 of the electronic component 41.

At the inner periphery wall 52a (inner periphery) of each of the lattice windows W of the frame portion 52, a plurality of concave portions 53 having opening width of Δs are arranged in parallel at an equal interval. In other words, a plurality of the concave portions 53 are formed by notching a part of the inner periphery wall 52a of each of the windows W of the frame portion 52, at an equal interval in an approximately rectangular parallelepiped shape. These concave portions 53 are formed so as to correspond to the boundaries (separating planes) of the individual substrates 300 mentioned later, respectively. Moreover, holes 54 are formed between the neighboring concave portions 53. A plurality of the holes 54 are formed at an equal pitch on a straight line connecting the neighboring concave portions 53. Moreover, at the outer periphery of the holes 54, a plurality of holes 55 are formed at a pitch equivalent to the interval of the holes 54.

The materials that can be used for the plate-like integrated frame 51 are not particularly limited as long as such materials satisfy the following formula: $\alpha 1 < \alpha 3$ and $\alpha 2 < \alpha 3$ . . . (1) (where, $\alpha 1$ indicates the linear coefficient of thermal expansion (ppm/K) of the electronic component 41, $\alpha 2$ indicates the linear coefficient of thermal expansion (ppm/K) of the plate-like integrated frame 51, and $\alpha 3$ indicates the linear coefficient of thermal expansion (ppm/K) of the substrate 11, each of the wiring layers, or each of the insulating layers). Since, for an electronic component, substrate, wiring layer, and insulating layer which are used for this kind of application, in general, $\alpha 1$ is on the order of 1 to 8 ppm/K and $\alpha 3$ is on the order of 14 to 20 ppm/K, it is preferable for $\alpha 2$ to be 3 to 16 (ppm/K). More specifically, metals, alloys, resins, and the like having the linear coefficient of thermal expansion of 3 to 16 (ppm/K) are included, for example, SUS400 (11 ppm/K), SUS410 (11 ppm/K), SUS430 (10.5 ppm/K), SUS630 (11 ppm/K), SUS631 (10 ppm/K), SUS316 (16 ppm/K), 42Alloy (4.5 ppm/K), INCONEL (14 ppm/K), nickel (12.5 ppm/K), nickel-chrome-molybdenum steel (11 ppm/K), iron (11 ppm/K), cast iron (10 ppm/K), titanium (9 ppm/K), aromatic polyamide (product name: MICTRON GQ; 13 ppm/K), aromatic polyamide (product name: MICTRON ML; 3 ppm/K), PET (15 ppm/K), polyimide (3 to 15 ppm/K), and the like are included. Among these materials, it is preferable to use SUS430 or INCONEL from points of view, such as processability, availability, stiffness, cost, and among them it is more preferable to use SUS430.

Hereinafter, with reference to FIG. 6 to FIG. 15, a method for manufacturing a work board containing four worksheets in which a plurality of electronic components 41 are embedded, as the above-mentioned work board 100, will be described.

Figure 7:
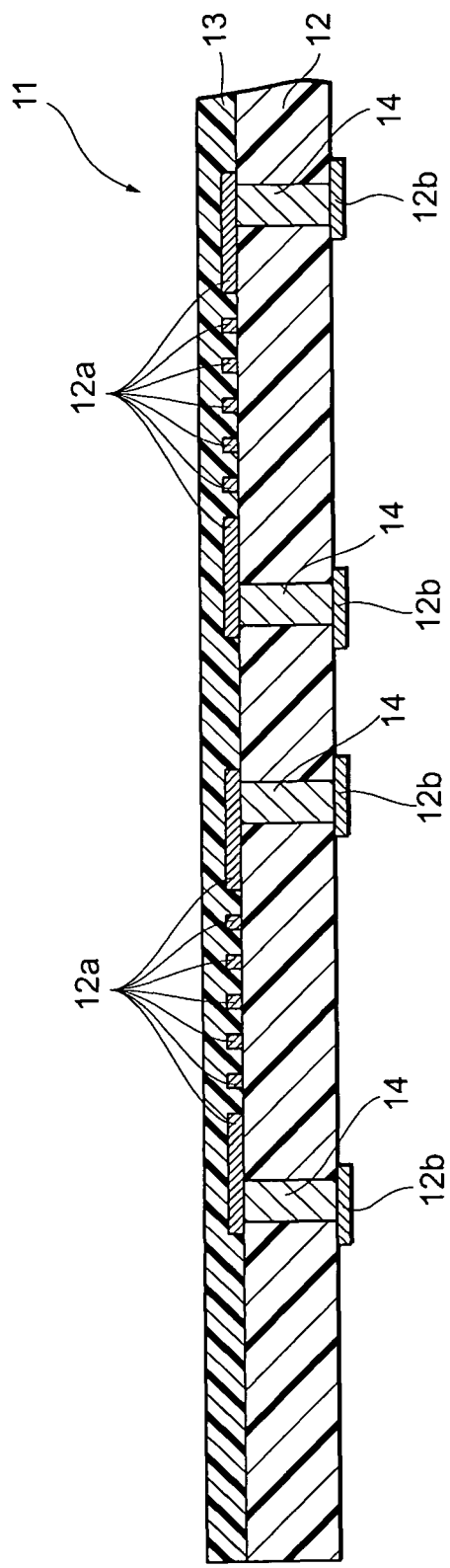
FIG. 7 is a process view illustrating another example of steps for manufacturing the work board 100.

First, a substrate 11 in which wiring layers (patterns) 12a and 12b and vias 14 are formed is provided (FIG. 6) using a known method involving drilling double-sided copper-clad glass epoxy, subjecting it to electroless plating and electrolytic plating, and subsequently, removing an unnecessary portion by means of etching. Here, circuit configuration groups each consisting of the wiring layers 12a and 12b and the vias 14 are formed with being apart from each other at four positions each corresponding to each of the lattice windows W of the plate-like integrated frame 51 (not shown). Each of the circuit configurations is formed separately so as to correspond to a respective target individual substrate. Then, an insulating layer 13 is further formed on top of the wiring layer 12a of the substrate 11 (FIG. 7). Subsequently, the substrate 11 obtained through the operations described above is mounted and fixed to a predetermined position on a stainless steel workstage, not shown, whereby the following processes are performed thereon.

Figure 8:
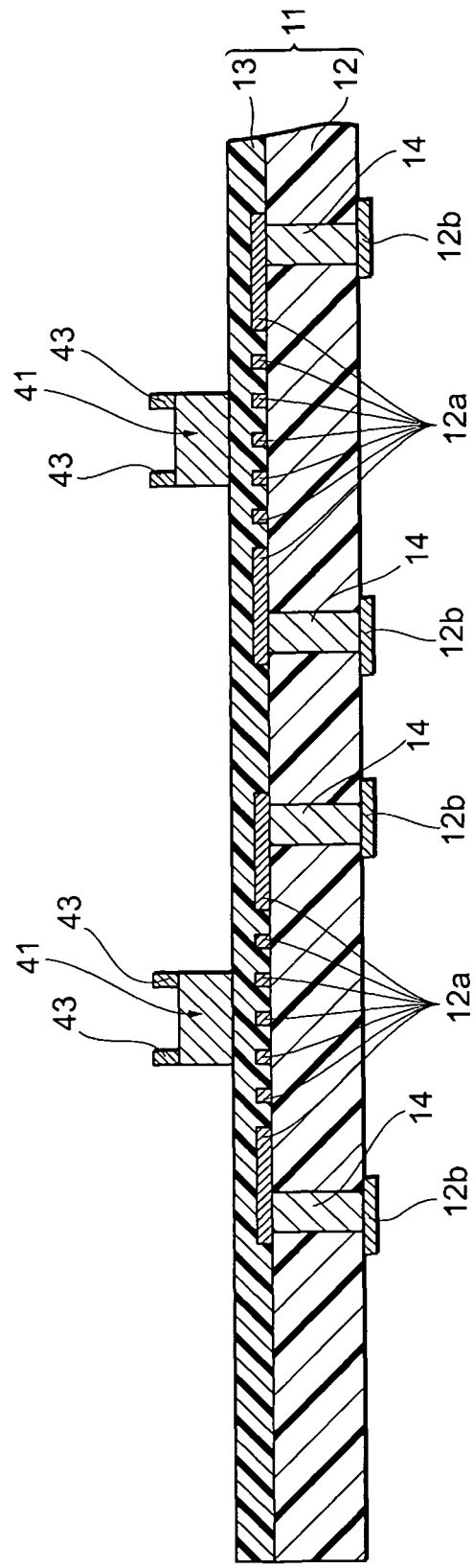
FIG. 8 is a process view illustrating a further example of steps for manufacturing the work board 100.
Figure 9:
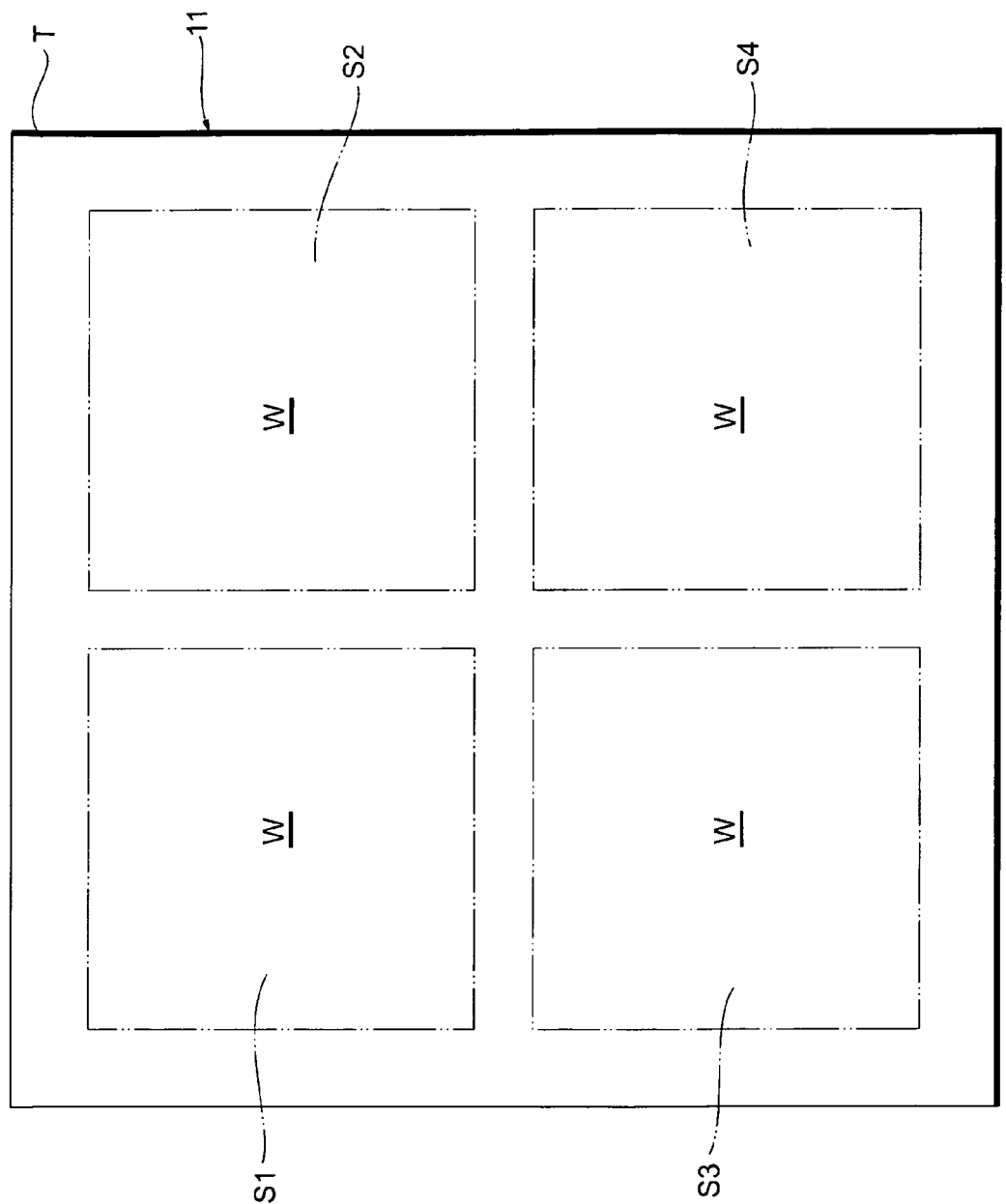
FIG. 9 is a process view illustrating a still further example of steps for manufacturing the work board 100.

Next, the electronic components 41 are mounted on predetermined positions within product areas S1 to S4 on the insulating layer 13 of the substrate 11 (FIG. 8 and FIG. 9). Here, the product areas S1 to S4 are areas for producing the target individual substrates which are defined based on circuit configuration groups such as the wiring layers 12a and 12b, and vias 14. In addition, in FIG. 9, for ease of understanding, description of the electronic components 41 is omitted. Here, since, as mentioned-above, four equal circuit configuration groups are formed on the substrate 11 at four positions each corresponding to each of the lattice windows W of the plate-like integrated frame 51, the product areas S1 to S4 spaced apart from each other in a grid of 2×2 are defined so as to correspond to each of the four equal circuit configuration groups, and a lattice-like non-product area T (area except for the product areas S1 to S4) is defined (FIG. 9).

Figure 10:
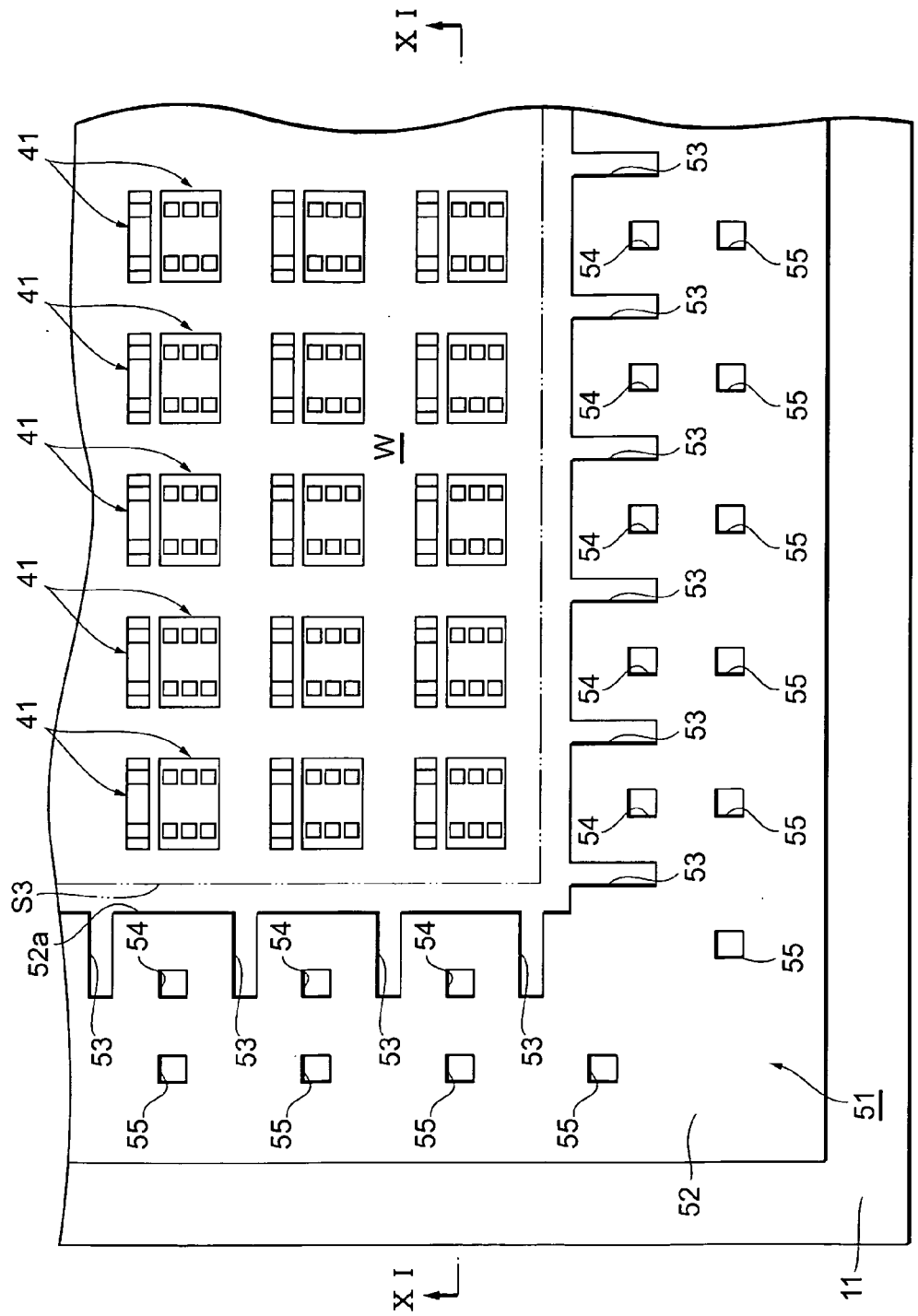
FIG. 10 is a process view illustrating a still more further example of steps for manufacturing the work board 100.
Figure 11:
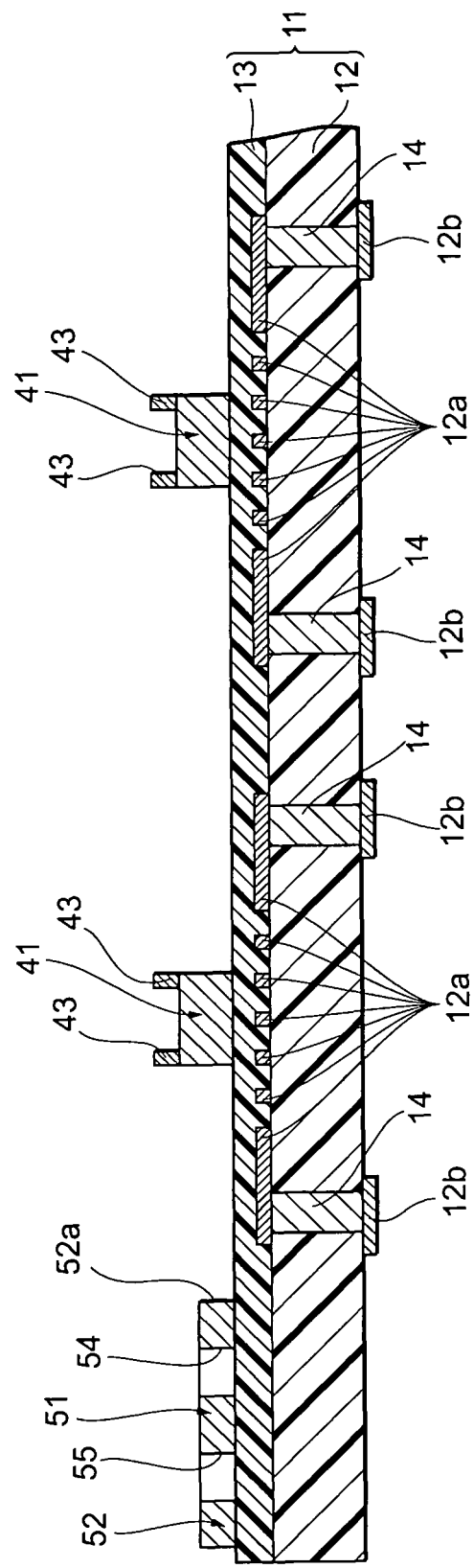
FIG. 11 is a cross-sectional view along a line XI-XI in FIG. 10.
Figure 12:
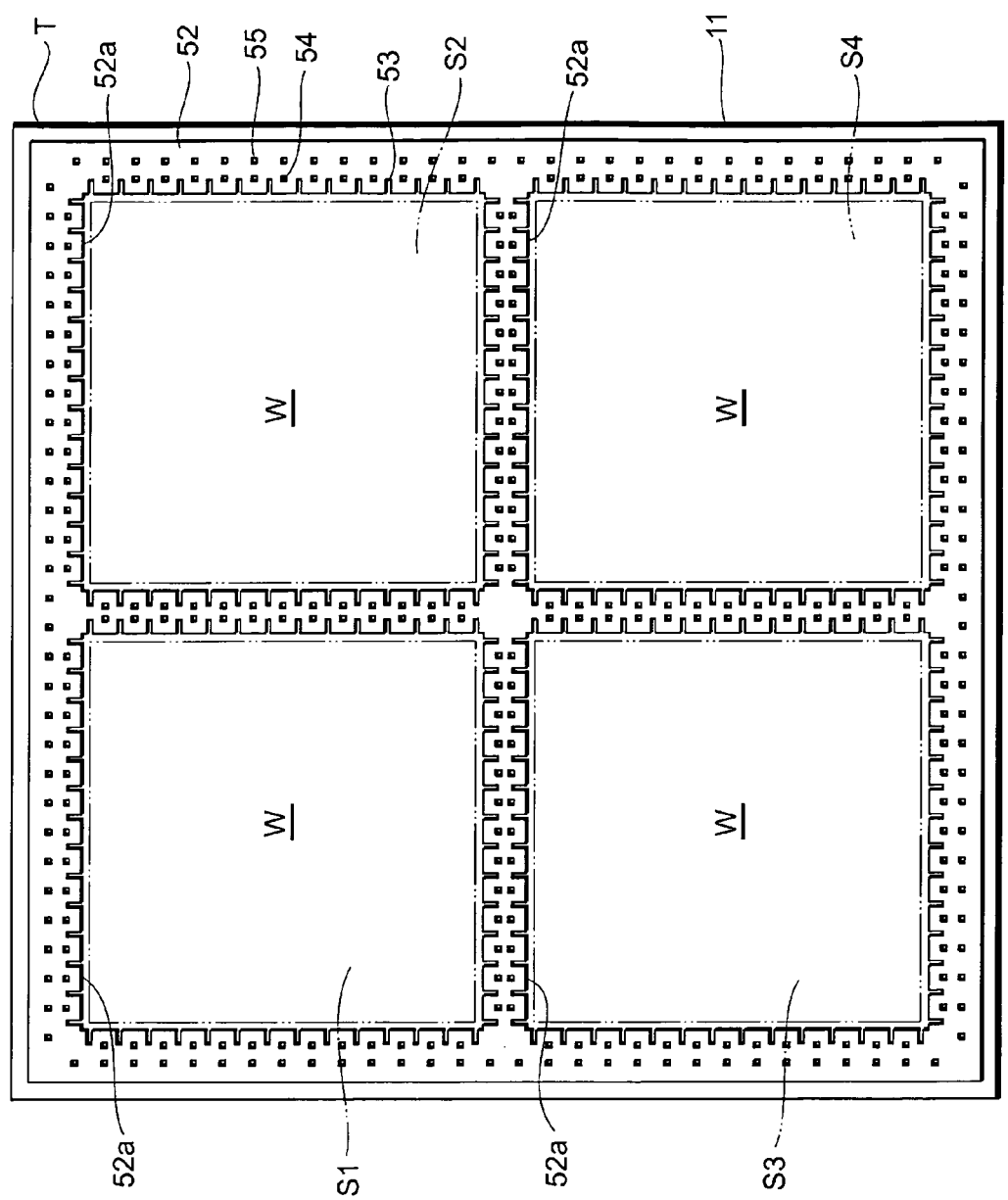
FIG. 12 is a process view illustrating the other example of steps for manufacturing the work board 100.

Further, the plate-like integrated frame 51 is mounted on the insulating layer 13 of the substrate 11 (FIG. 10 to FIG. 12). In addition, in FIG. 12, for ease of understanding, description of the electronic components 41 is omitted. Here, the plate-like integrated frame 51 is mounted on a predetermined position of the non-product area T that is a portion on which the electronic components 41 are not mounted so that each of the lattice windows W of the plate-like integrated frame 51 corresponds to each of the product areas S1 to S4. Thus, the plate-like integrated frame 51 is mounted so as to surround the product areas S1 to S4 (FIG. 10 to FIG. 12). Moreover, the electronic component 41 and the plate-like integrated frame 51 are mounted on the same plane on the insulating layer 13 of the substrate 11 (FIG. 11). In addition, placement of the plate-like integrated frame 51 may be performed before the placement of the electronic components 41, or may be performed simultaneously with the placement of the electronic components 41.

Figure 13:
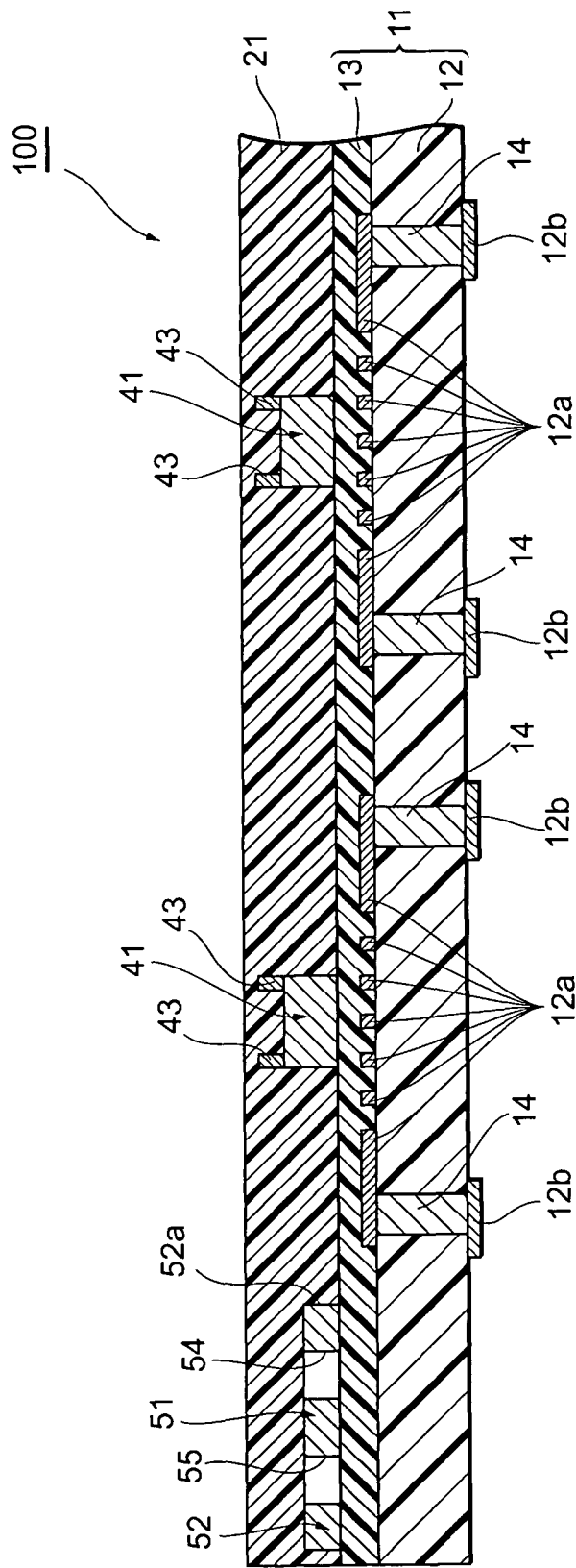
FIG. 13 is a cross-sectional view illustrating the schematic configuration of the work board 100.

After that, as mentioned above, the insulating layer 21 is formed so as to cover the electronic components 41 and the plate-like integrated frame 51 mounted on the insulating layer 13 of the substrate 11 (FIG. 13). Specifically, the insulating layer 21 is formed by applying an un-cured or partially cured thermosetting resin on the insulating layer 13 of the substrate 11 and curing it while applying heat to it. The work board 100 of the present embodiment is obtained through the operations described.

When forming the insulating layer 21, it is preferable that after applying the thermosetting resin in an uncured or partially cured state and applying heat to partially cure the thermosetting resin, curing and forming are performed using pressing means. As a result, adhesion between the wiring layers 12a and 12b, the insulating layers 12, 13 and 21, the electronic components 41, and the plate-like integrated frame 51 will be improved. If necessary, the curing and molding of the insulating layer 21 may be performed while applying heat to it. In other words, various known means may be employed for forming the insulating layer 21. For example, in addition to methods such as screen printing and spin coating, pressing, vacuum lamination, pressure lamination and the like are also employable.

Moreover, when the plate-like integrated frame 51 thinner than the thickness t1 of the electronic components 41 is used as the case of the present embodiment, since space volume fraction occupying in the insulating layer 21 decreases toward the direction of the outer periphery of the substrate 11, the un-cured (partially cured) resin tends to pass through the non-product areas T from the product areas S1 to S4 and to flow toward the outer periphery of the substrate 11 at the time of curing and press-molding the insulating layer 21. Therefore, it will be easy to impart pressure to the product areas S1 to S4 uniformly, resulting in improvement of adhesion between the wiring layers 12a and 12b, the insulating layers 12, 13 and 21, the electronic components 41, and the plate-like integrated frame 51, and thickness uniformity and flatness of the work board 100. Further, since air bubbles which may be present and included between the wiring layers 12a and 12b, the insulating layers 12, 13 and 21, the electronic components 41, and the plate-like integrated frame 51 can now be removed efficiently, occurrences of manufacturing/processing problems can be suppressed and process yield and mounting reliability can be improved.

Figure 14:
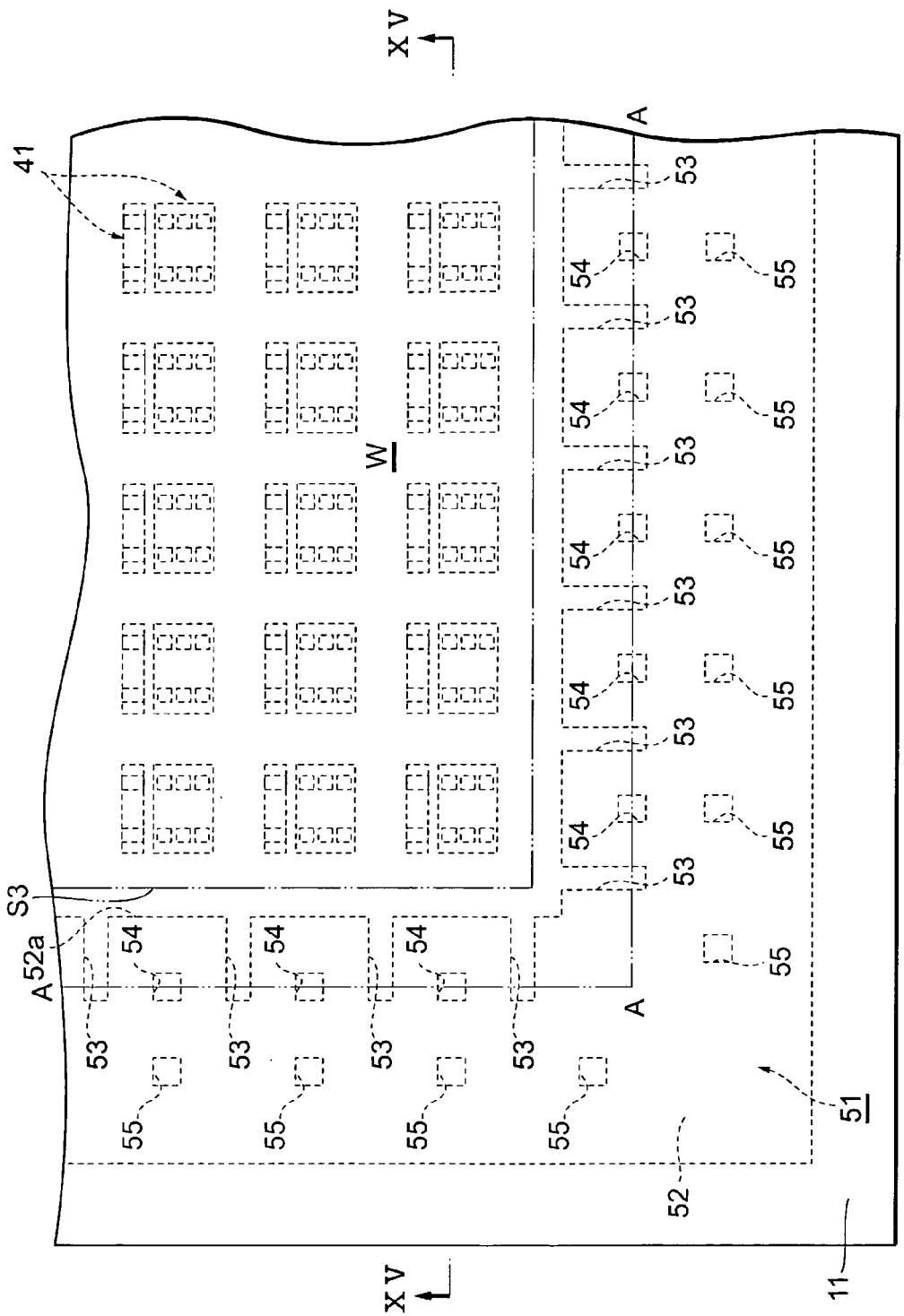
FIG. 14 is a process view illustrating an example of steps for manufacturing a worksheet 200.
Figure 15:
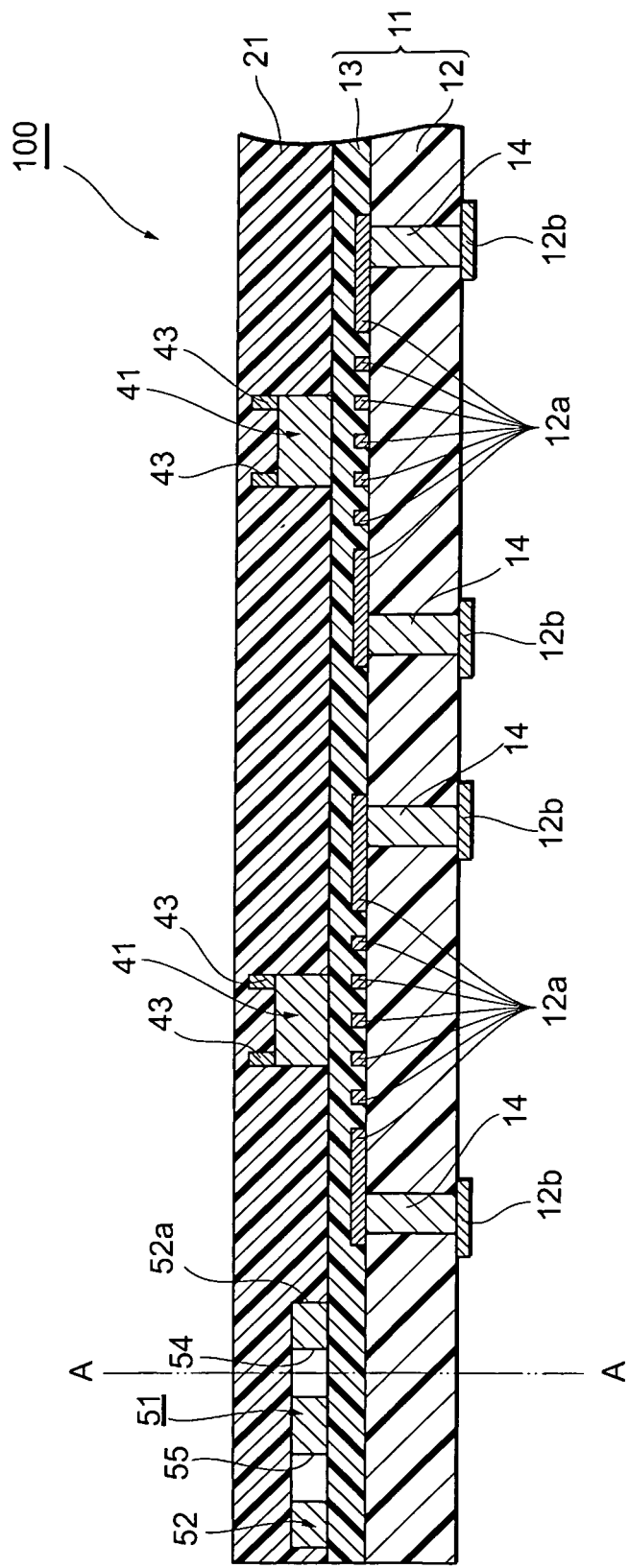
FIG. 15 is a cross-sectional view along a line XV-XV in FIG. 14.

Then, the work board 100 obtained through the operations described is separated in a separating plane that is a plane along a straight line (line A-A in the figure) connecting and crossing a plurality of the concave portions 53 and holes 54, so as to separate the substrate 11 together with the plate-like integrated frame 51, using a known method involving, for example, separating by means of a separating tool such as a dicer. Accordingly, four worksheets 200 can be obtained with the product areas S1 to S4 substantially divided into pieces (FIG. 14 and FIG. 15).

Figure 16:
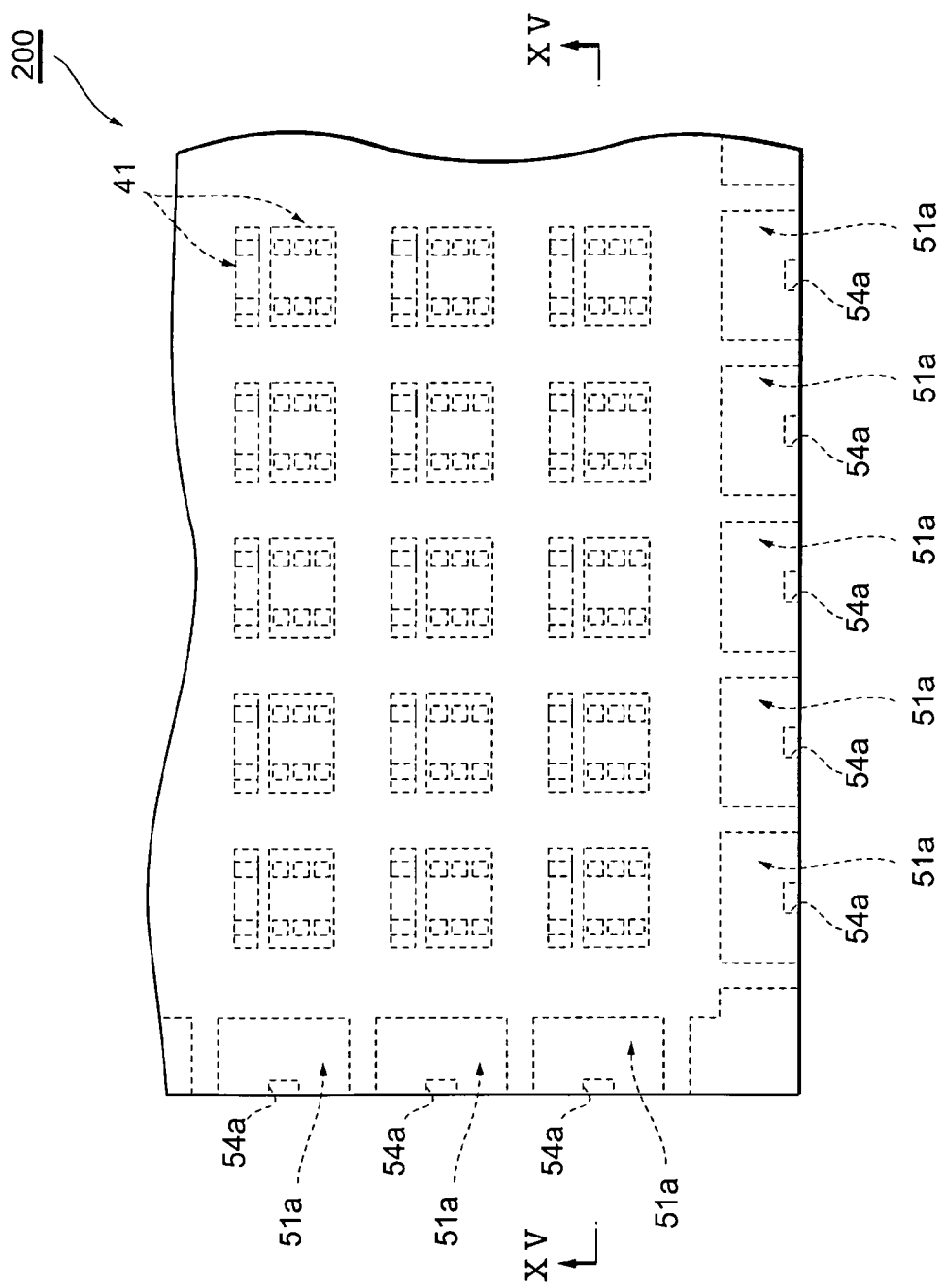
FIG. 16 is a plan view illustrating the main part of the worksheet 200.
Figure 17:
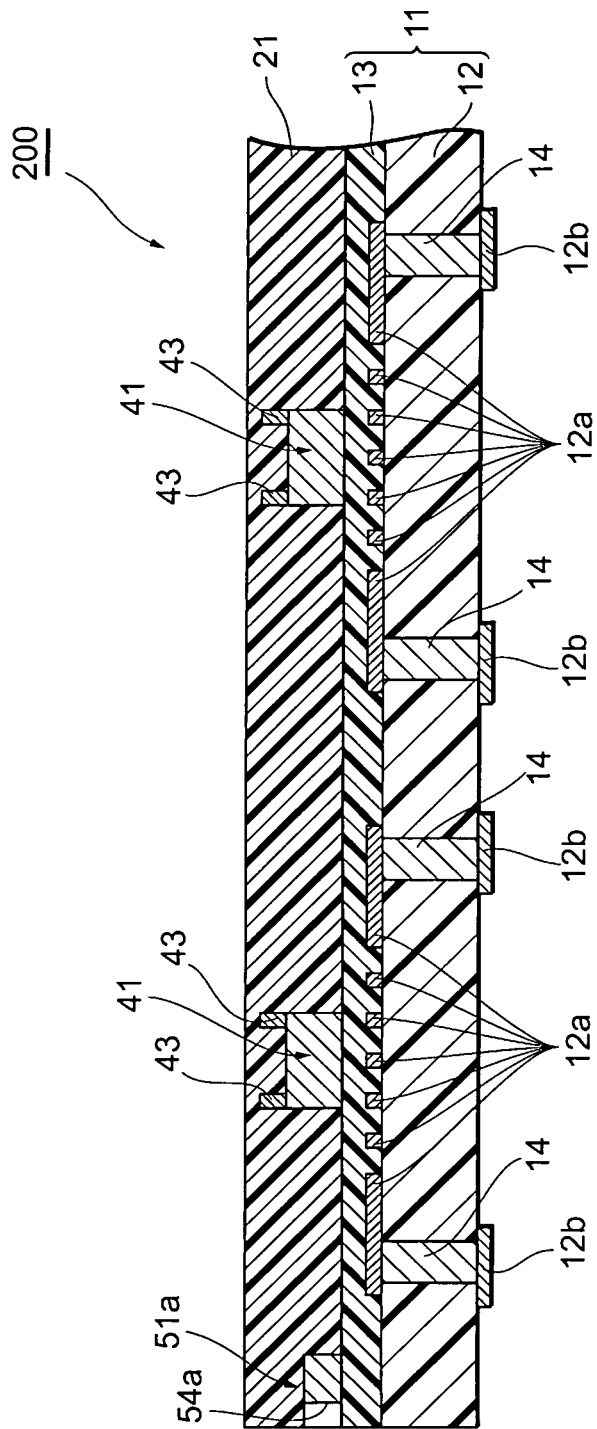
FIG. 17 is a cross-sectional view along a line XVII-XVII in FIG. 16.

FIG. 16 and FIG. 17 are a main part enlarged plan view and a main part enlarged cross-sectional view schematically illustrating the structure of the worksheet 200, respectively. The worksheet 200 is an electronic component-embedded assembly substrate capable of producing a plurality of individual substrates, on which the insulating layer 21 is provided on one surface (upper surface in the figures) of the substantially rectangular-shaped substrate 11, and the electronic components 41 and the plate-like integrated frame 51 are embedded at predetermined positions inside the insulating layer 21.

The worksheet 200 has a configuration in which a plurality of cut pieces 51a (separated pieces) of the plate-like integrated frames 51 are present at its outer periphery (outer edge) in a shape of a frame with being separated each other. The cut pieces 51a are approximately C-shaped structures each having a concave portion 54a formed by separating a part of the hole 54 of the plate-like integrated frames 51, and are exposed together with the concave portions 54a at the outer periphery wall (outer periphery plane) of the worksheet 200.

Hereinafter, with reference to FIG. 18 to FIG. 25, a method for producing individual substrates 300 from the above-mentioned worksheet 200 will be described.

Figure 18:
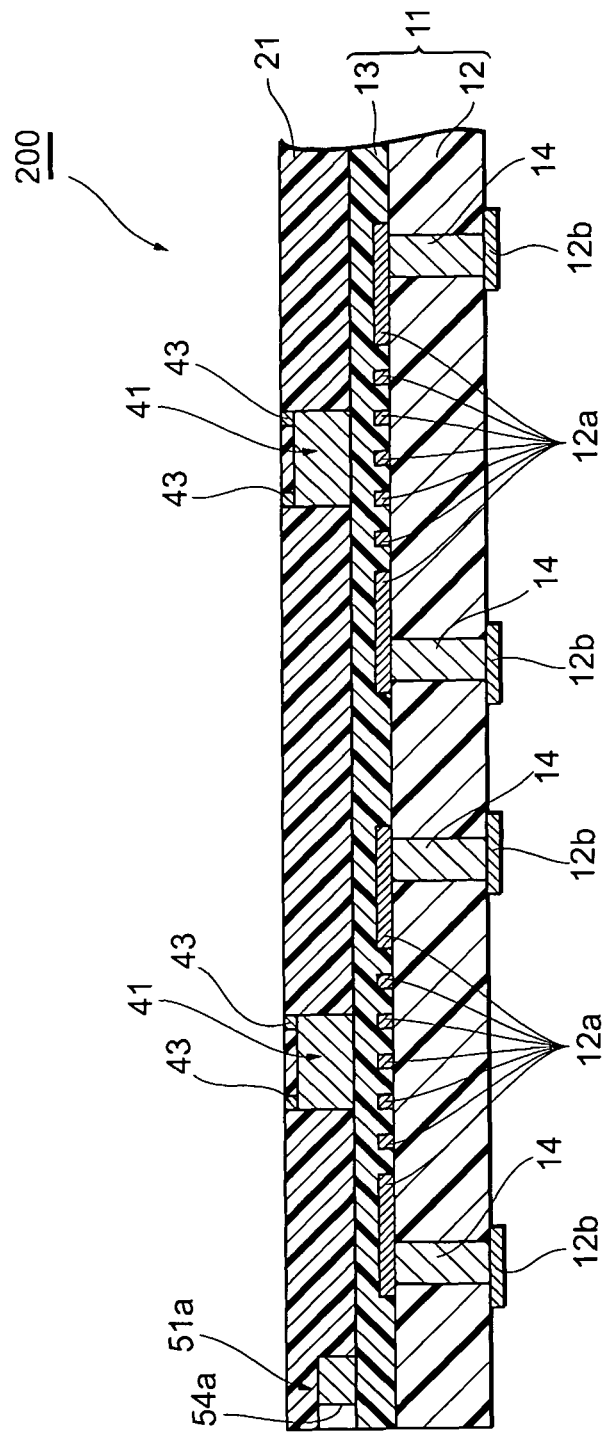
FIG. 18 is a process view illustrating an example of steps for manufacturing an individual substrate 300.

First, by removing a part of the insulating layer 21 of the worksheet 200, the bumps 43 of the electronic components 41 are exposed (FIG. 18). As the method for removing the insulating layer 21, a known method can be selected as required. Specifically, those methods include, for example, polishing using a grinder, blasting, and irradiation of carbon dioxide laser.

Figure 19:
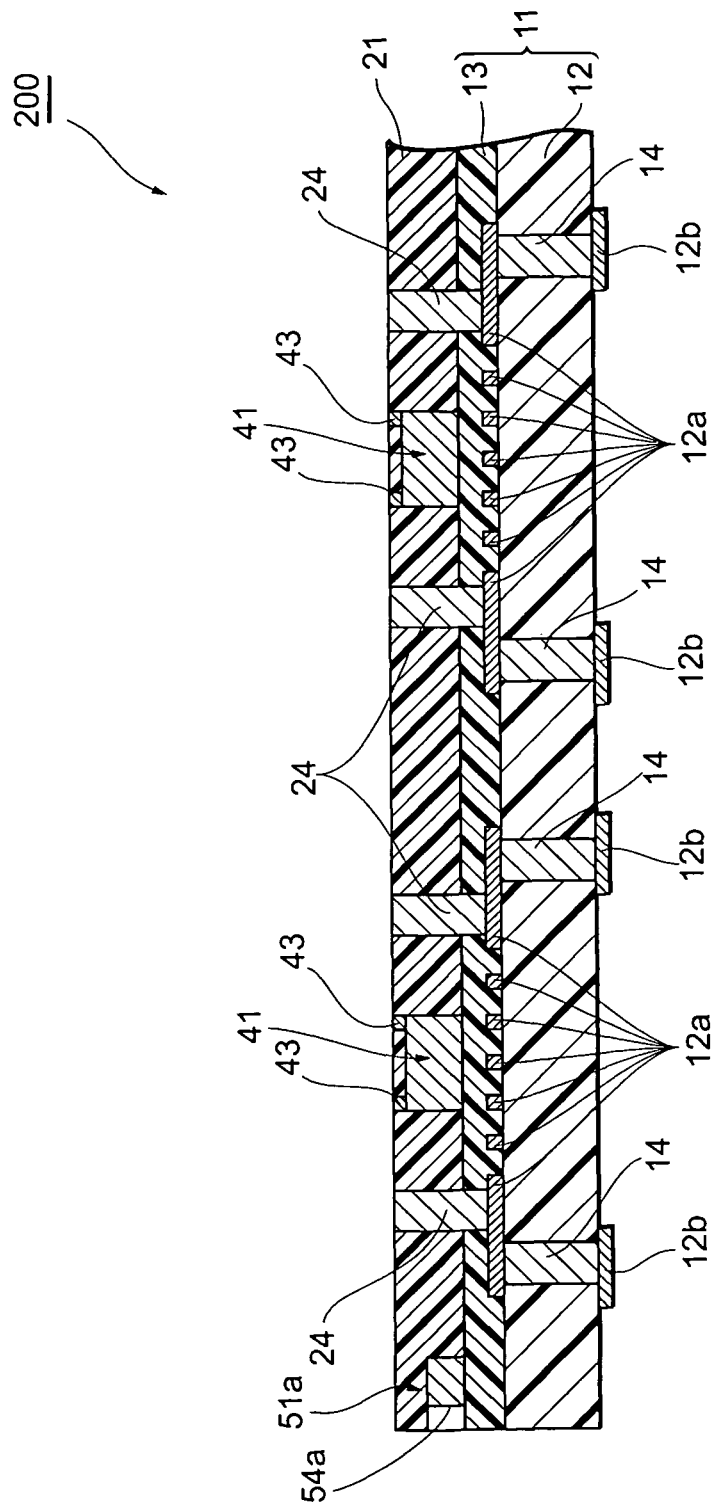
FIG. 19 is a process view illustrating another example of steps for manufacturing the individual substrate 300.
Figure 20:
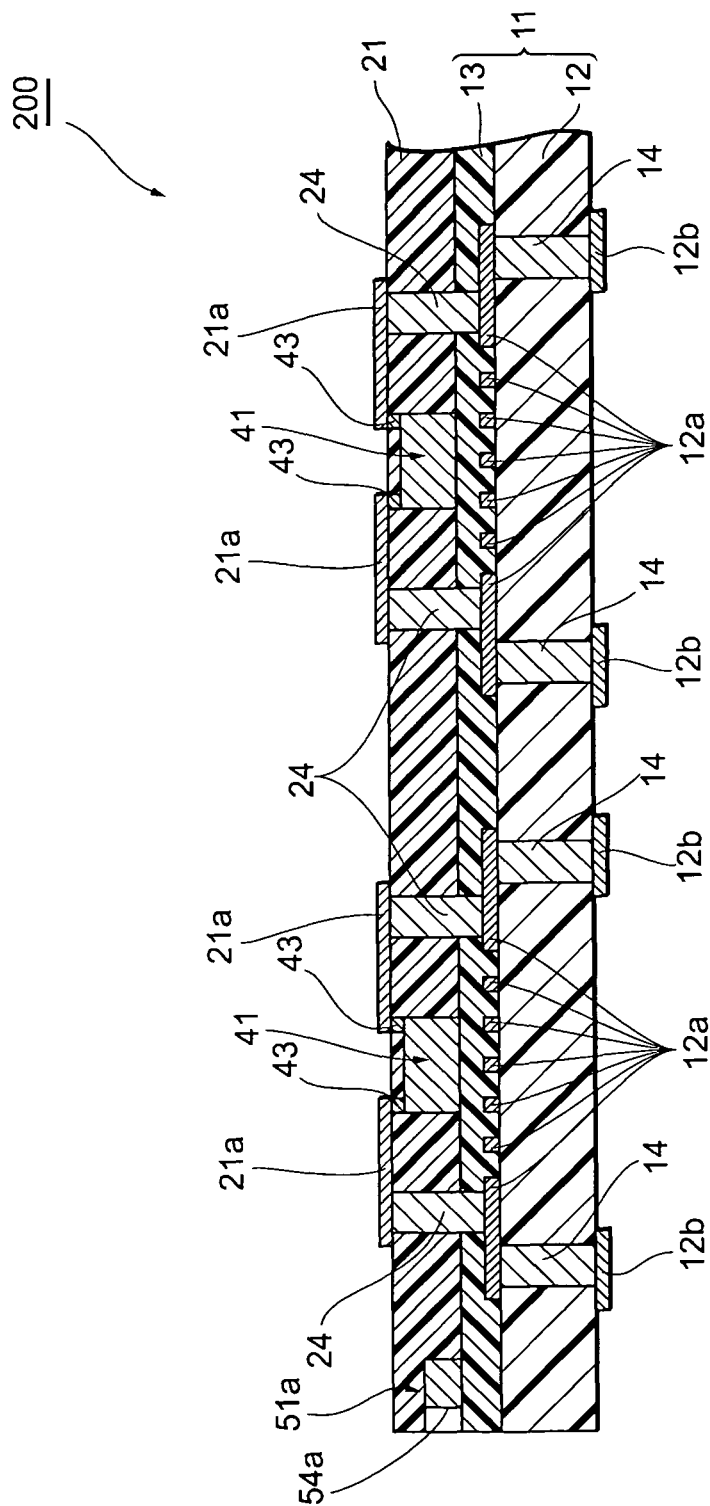
FIG. 20 is a process view illustrating a further example of steps for manufacturing the individual substrate 300.

Vias 24 to penetrate the insulating layers 13 and 21 are respectively formed using a known method (FIG. 19). Then, using a known method such as the subtractive method or the additive method, a wiring layer 21a is formed on the insulating layer 31 in order to electrically connect the electronic components 41, the bumps 43, and the wiring layers 21a and 12a via the vias 14 and 24 (FIG. 20).

Figure 21:
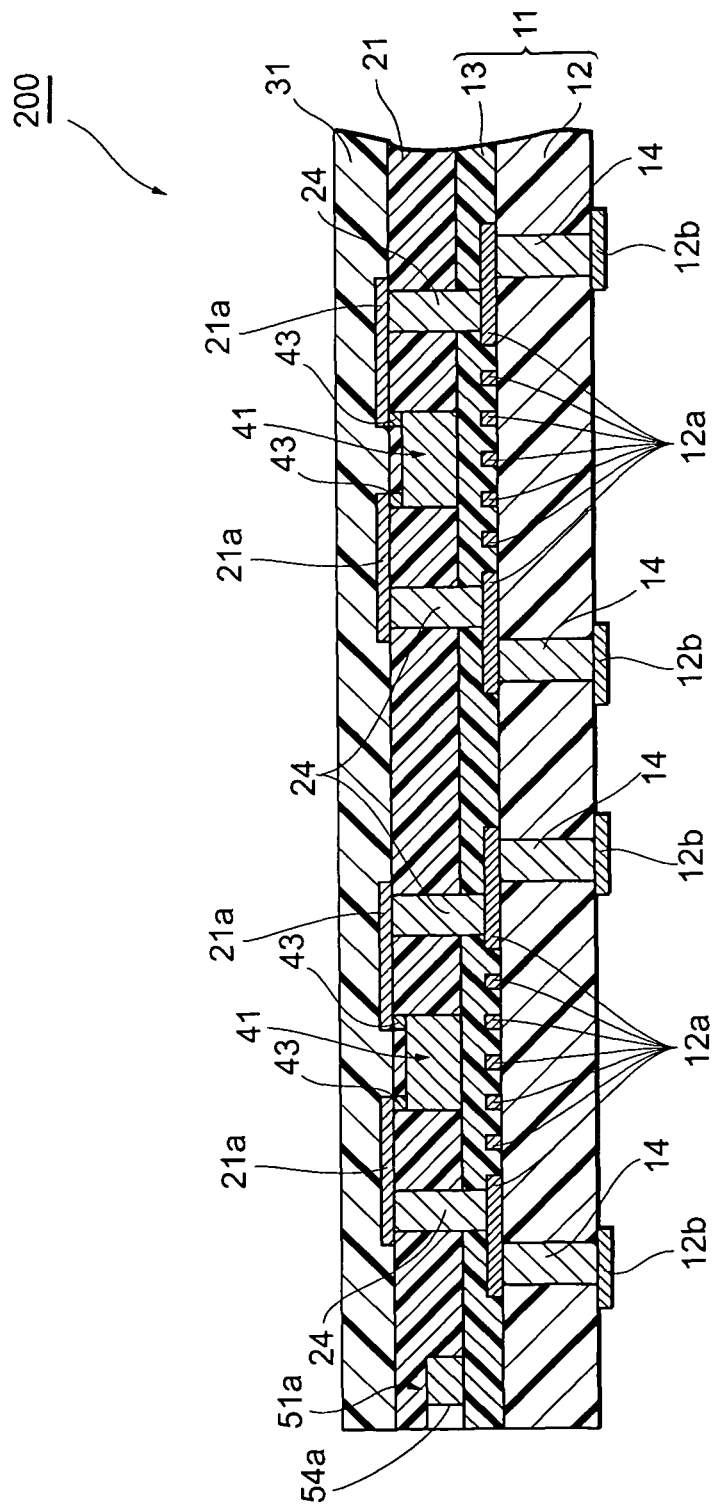
FIG. 21 is a process view illustrating a still further example of steps for manufacturing the individual substrate 300.

After that, by forming the insulating layer 31 consisting of a thermosetting resin on the insulating layer 21, according to an accepted method, the worksheet 200 having a configuration illustrated in FIG. 21 is obtained. This insulating layer 31 can be made using the same resin material and composite material as those of the above-mentioned insulating layer 21, and using the same forming method as that of the above-mentioned insulating layer 21. Preferably, in the same way as the case for forming the above-mentioned insulating layer 21, the insulating layer 31 is formed by applying an insulating epoxy resin, that is an un-cured or partially cured thermosetting resin, on the insulating layer 21, then half-curing it while applying heat to it, and subsequently, curing it using pressing means.

As mentioned above, when the insulating layer 31 is cured and press-molded in the same manner as the case of the insulating layer 21, adhesion between the wiring layers 12a, 12b and 21a, the insulating layers 12, 13, 21 and 31, the electronic components 41, the plate-like integrated frame 51, and the cut pieces 51a, and thickness uniformity and flatness of the worksheet 200 and the product areas S1 to S4 are improved. Further, since air bubbles which may be present and included between each of the wiring layer 21a, and the insulating layers 21 and 31 are efficiently removed, occurrence of manufacturing/processing troubles can be suppressed, enabling yield and mounting reliability in manufacture to be improved.

Figure 22:
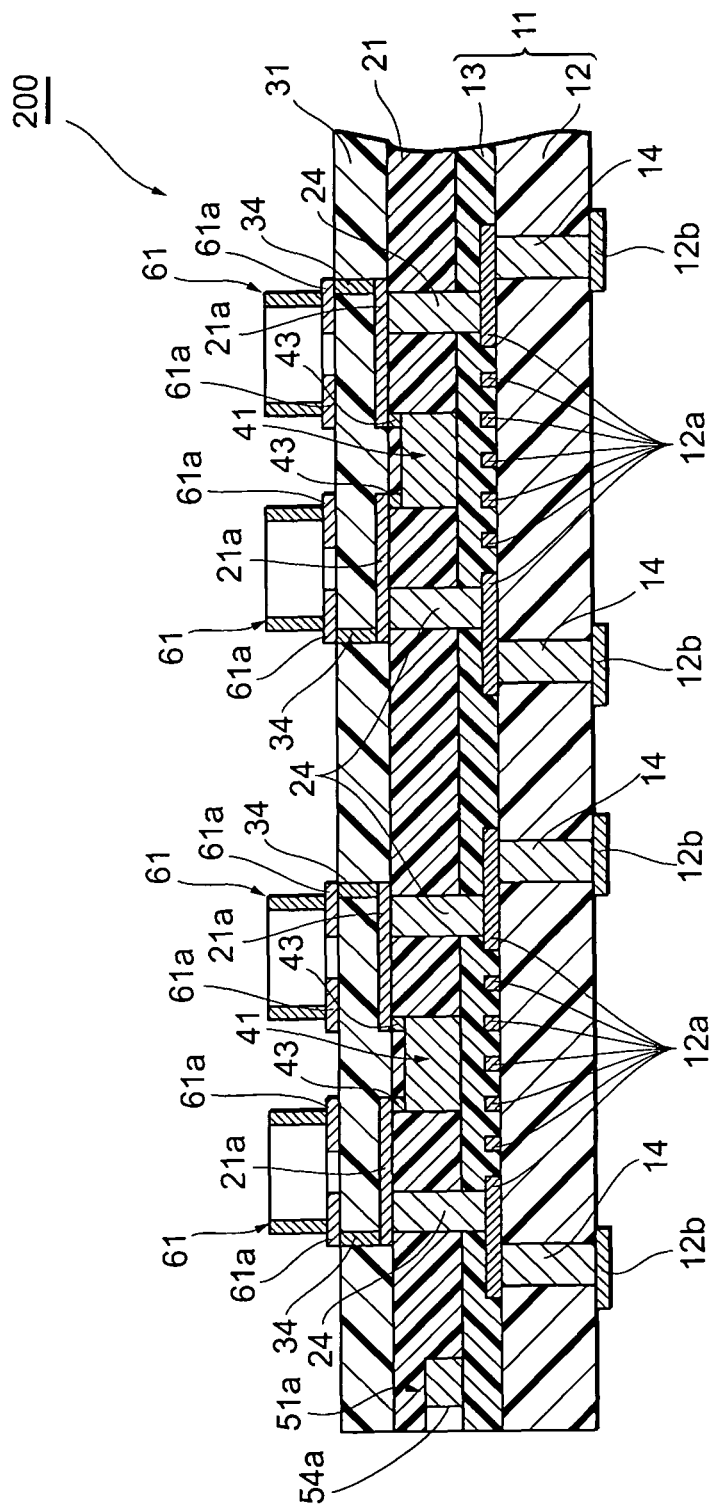
FIG. 22 is a cross-sectional view illustrating the schematic configuration of an electronic component-embedded module 201.

Further, by surface mounting desired electronic components on the worksheet 200, an electronic component-embedded module (worksheet; electronic component-embedded substrate) is obtained. As an example, an electronic component-embedded module 201 in which vias 34 penetrating through a wiring layer 61a and the insulating layer 31 are formed, and on which passive components 61 such as resistors or capacitors are mounted, is illustrated (FIG. 22).

Figure 23:
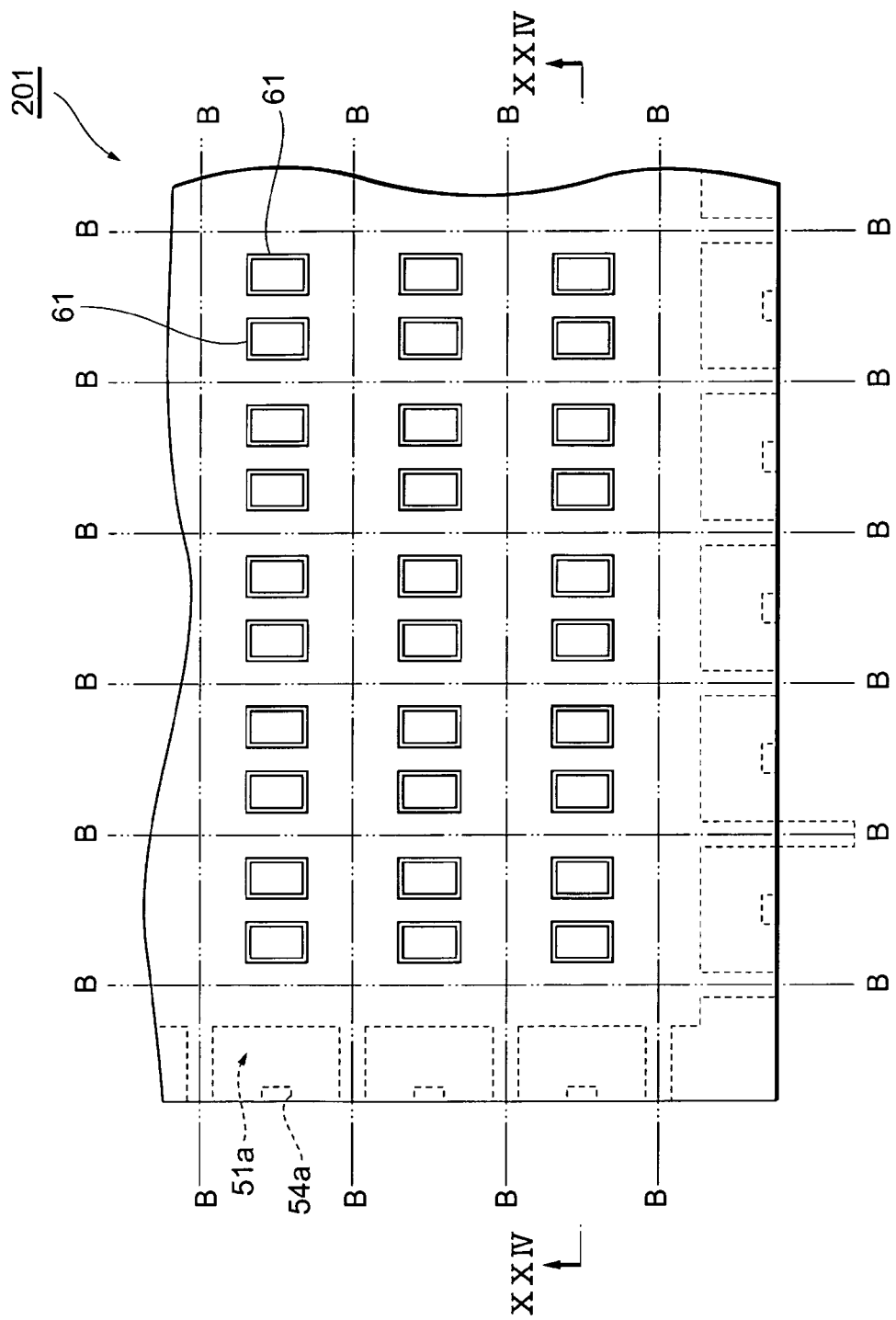
FIG. 23 is a process view illustrating the other example of steps for manufacturing the individual substrate 300.
Figure 24:
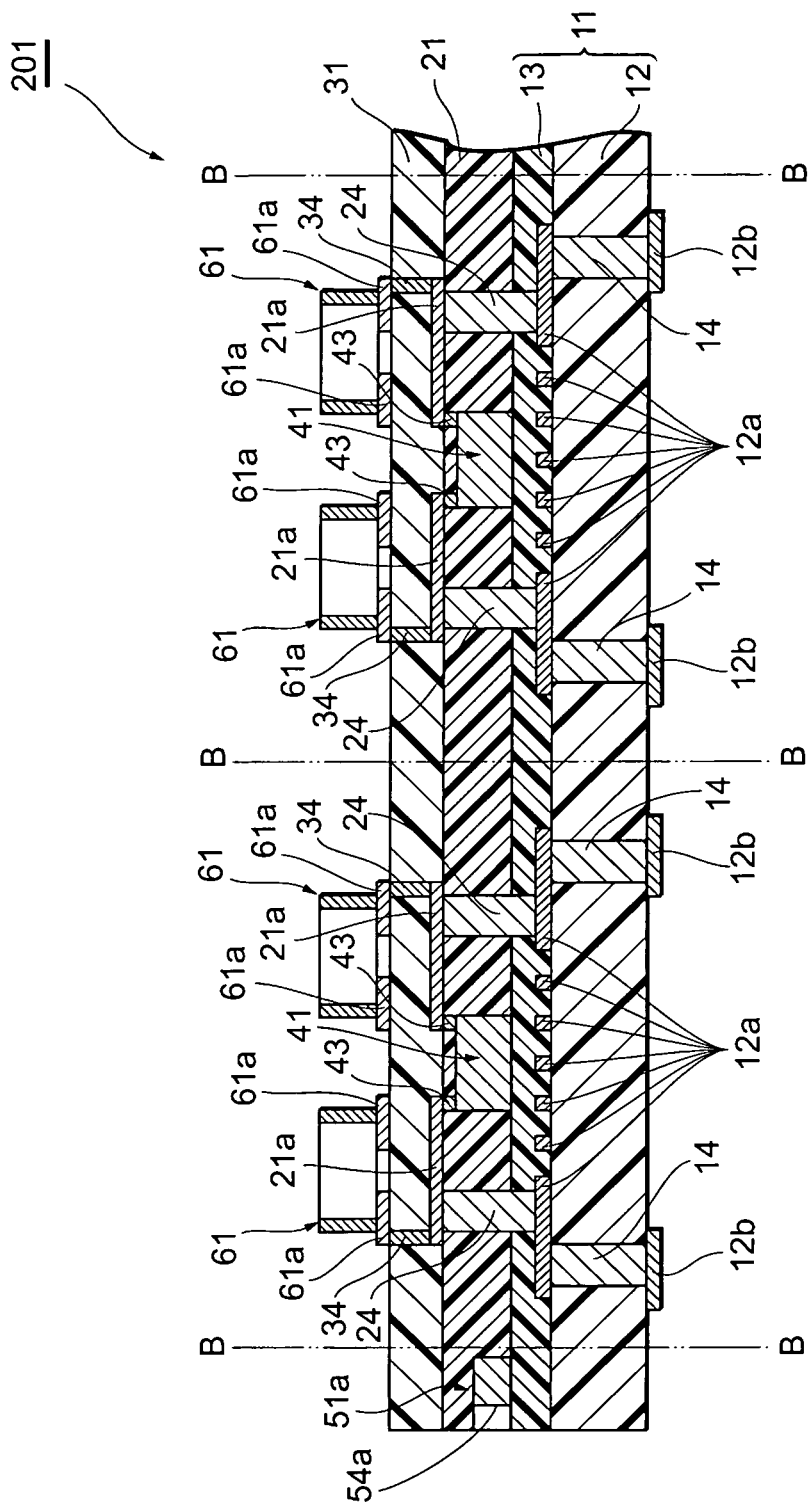
FIG. 24 is a cross-sectional view along a line XXIV-XXIV in FIG. 23.
Figure 25:
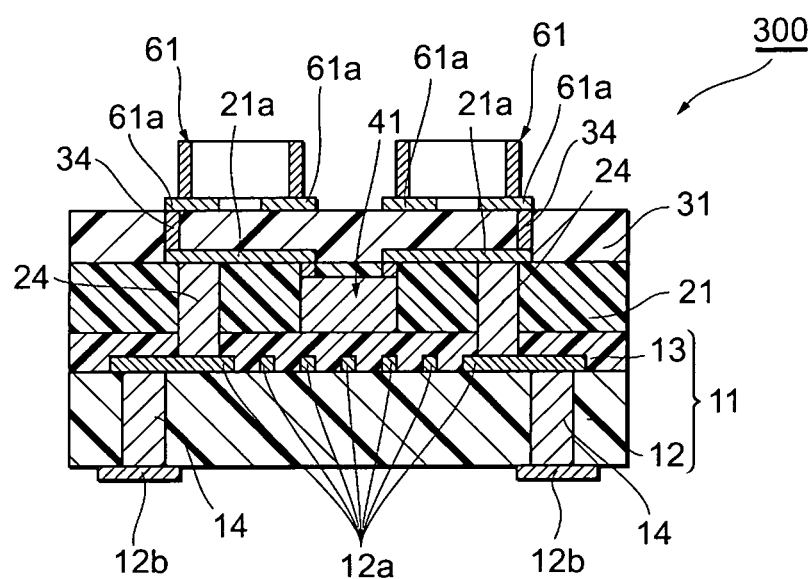
FIG. 25 is a cross-sectional view illustrating the schematic configuration of the individual substrate 300.

After that, by dividing the electronic component-embedded module 201 obtained by the above-mentioned manner into predetermined size pieces, individual substrates 300 (electronic component-embedded substrate) are obtained (FIG. 23 to FIG. 25). Specifically, the electronic component-embedded module 201 is separated in planes along straight lines connecting cut pieces 51a of the electronic component-embedded module 201 (lines B-B in the figures; approximately in between the concave portions 53 of the plate-like integrated frame 51) using a known method involving, for example, performing separating by means of a router, so as to remove the cut pieces 51a and obtain each of the individual substrates 300 (FIG. 23 to FIG. 25).

Here, in the present embodiment, as mentioned above, by forming the concave portions 53 in the plate-like integrated frame 51 so as to correspond to the boundaries of the individual substrates 300 (separating planes) and by separating straight lines (lines A-A) connecting and crossing a plurality of the concave portions 53, the worksheets 200 (the electronic component-embedded modules 201) are produced. Therefore the obtained worksheet 200 (the electronic component-embedded module 201) can be separated at straight lines (lines B-B) connecting the cut pieces 51a, and when this separating is performed, since the separated planes have no cut piece 51a, separating will be facilitated and the lifetime of a separating tool can be extended by, for example, reduction of load on the edge of the router.

According to the above-mentioned manufacturing method of the work board 100, since the plate-like integrated frame 51 is mounted on the portion on which the electronic components 41 of the substrate 11 are not mounted so as to surround assembly bodies containing a plurality of individual substrates 300, the substrate strength is enhanced substantially isotropically without extreme local difference (that is, without directional anisotropy). Therefore, the obtained work board 100 will have suppressed warpage and improved substrate strength, thereby, handling at the time of manufacturing/processing such as transferring and separating will be facilitated.

Moreover, since the lattice-like plate-like integrated frame 51 is used, the substrate strength can be improved further without directional anisotropy.

Moreover, since the plate-like integrated frame 51 is used, in which a plurality of the concave portions 53 are arranged in parallel at its inner periphery wall 52a, the substrate 11 can be separated on a line crossing a plurality of the concave portions 53, together with the plate-like integrated frame 51, enabling a worksheet 200 on which cut pieces 51a of the plate-like integrated frame 51 are present at its outer periphery in a shape of a frame to be produced easily. Therefore, the substrate strength of the obtained worksheet 200 can be maintained substantially the same as that of the work board, and occurrence of warpage can be suppressed. Moreover, in this case, since the substantial separating area of the plate-like integrated frame 51 is reduced in the separating plane to an extent equivalent to the respective concave portions 53, separating is facilitated and the lifetime of a separating tool can be extended by, for example, reduction of load on the edge of the dicer. Moreover, since the exposure areas of the cut pieces 51a exposed to the outer periphery wall (separating plane) of the obtained worksheet 200 can be made small, peeling (releasing) of the membrane which may occur at this outer periphery wall, can be suppressed.

Further, since the holes 54 are provided on a line connecting neighboring concave portions 53 in the plate-like integrated frame 51, when the plate-like integrated frame 51 is separated on a line so as to cross the neighboring concave portions 53 and holes 54, the substantial separating area of the plate-like integrated frame 51 can be reduced further and exposure areas of the cut pieces 51a exposed to the outer periphery wall (separating plane) of the obtained worksheet 200 can be made smaller.

Moreover, since the holes 54 and the holes 55 are provided in the plate-like integrated frame 51, at the time of curing and press-molding of the insulating layer 21, the un-cured (partially cured) resin further tends to pass through the non-product area T from the product areas S1 to S4 and flow toward the outer periphery of the substrate 11.

Moreover, since such a plate-like integrated frame 51 having the linear coefficient of thermal expansion satisfying the above-mentioned formula (1) is used, difference in degree of thermal expansion and thermal contraction due to the difference in the linear coefficient of thermal expansion between each of the electronic component 41 and the substrate 11, wiring layers 12*a*, 12*b* and 21*a*, and the insulating layers 12, 13, 21, and 31, is reduced. In other words, as the linear coefficient of thermal expansion of the whole of the portions on which the electronic component 41 is not mounted (non-product area T) approaches to the linear coefficient of thermal expansion of the whole of the portions on which the electronic components 41 are mounted (product areas S1 to S4), the difference in degree of thermal expansion and thermal contraction between the whole of the portions on which the electronic components 41 are mounted and the whole of the portions on which the electronic components 41 are not mounted, will be reduced. Therefore, uneven internal stress which may occur at the time of heating and cooling at the time such as occasion when the insulating layers 21 and 31 are formed, is relaxed, thereby, occurrence of warpage of the work board 100, the worksheets 200, and the electronic component-embedded module 201, and the individual substrates 300 produced by them, can be suppressed.

The present inventors have found that the warpage of the electronic component-embedded substrate due to the above-mentioned difference in thermal expansion coefficient tends to be deteriorated as compared to a case of manufacture of a substrate not embedded with electronic components 41, and further, that when the thickness of the electronic component-embedded-substrate is made thin (equal to or smaller than 500 μm, especially, equal to or smaller than 400 μm), or the area of the electronic component-embedded substrate is made large, excessive warpage of the order of several tens of millimeters tends to occur with respect to the entire electronic component-embedded substrate. In other words, according to findings by the inventors, since the linear coefficient of thermal expansion of electronic components is usually smaller than the linear coefficient of thermal expansion of the substrate, the insulating layer, and the wiring layer, when the substrate is embedded with electronic components, the difference in the linear coefficient of thermal expansion between a placing area and an non-placing area of the electronic components will be larger than a case of manufacture of a substrate not embedded with electronic components, resulting in further deterioration of warpage. In order to improve this relationship, in this manufacturing method, a frame body made of a material having the linear coefficient of thermal expansion being smaller than those of the substrate, the insulating layer, and the wiring layer, is mounted on the non-placing area of the electronic components, so that the linear coefficient of thermal expansion of the non-placing area will be as small as the linear coefficient of thermal expansion of the product area. Therefore, since, by suppressing such excessive warpage, occurrence of manufacturing/processing troubles, such as reduction of positional accuracy at the time of transferring and build-up, and reduction of mounting positional accuracy at the time of surface mounting, can be suppressed, and handling ability at the time of manufacturing/processing can be improved, yield and mounting reliability can be improved.

Moreover, in the present embodiment, since the lattice-shape plate-like integrated frame 51 is used, difference in degree of thermal expansion and thermal contraction can be reduced in the sheet surface without directional anisotropy. Further, since the plate-like integrated frame 51 is mounted on the same plane as the plane on which the electronic components 41 are mounted, uneven internal stress in the thickness direction of the substrate 11 can be relaxed, enabling occurrence of warpage to be suppressed further.

Moreover, since the obtained work board 100 has suppressed warpage and improved substrate strength, it has improved handling ability at the time of manufacturing/processing, such as transferring, build-up, and surface mounting. Therefore, by using this work board 100, occurrence of subsequent manufacturing/processing troubles will be suppressed, thereby, yield is improved and mounting reliability is improved.

In addition, the above-mentioned embodiment is exemplification for describing the present invention, thereby, the present invention is not limited only to the embodiments thereof. In other words, unless departing from the gist, the present invention can be embodied in a variously changed manner.

Figure 26:
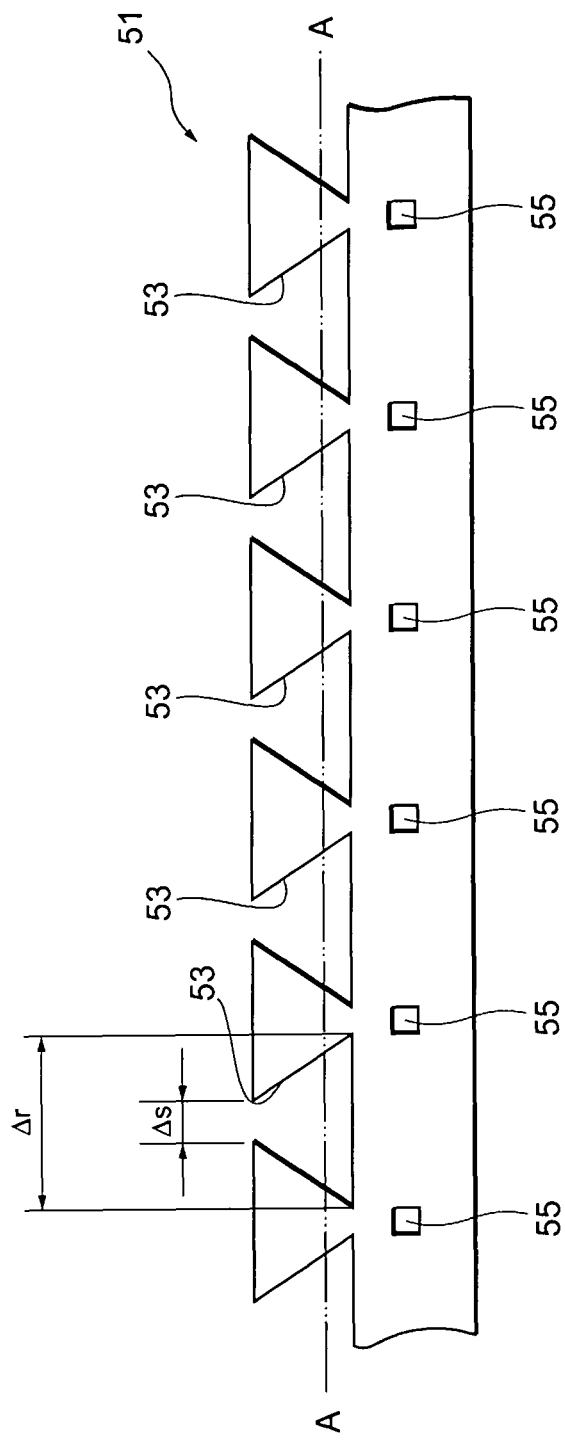
FIG. 26 is a plan view illustrating a modified embodiment of the plate-like integrated frame 51.
Figure 27:
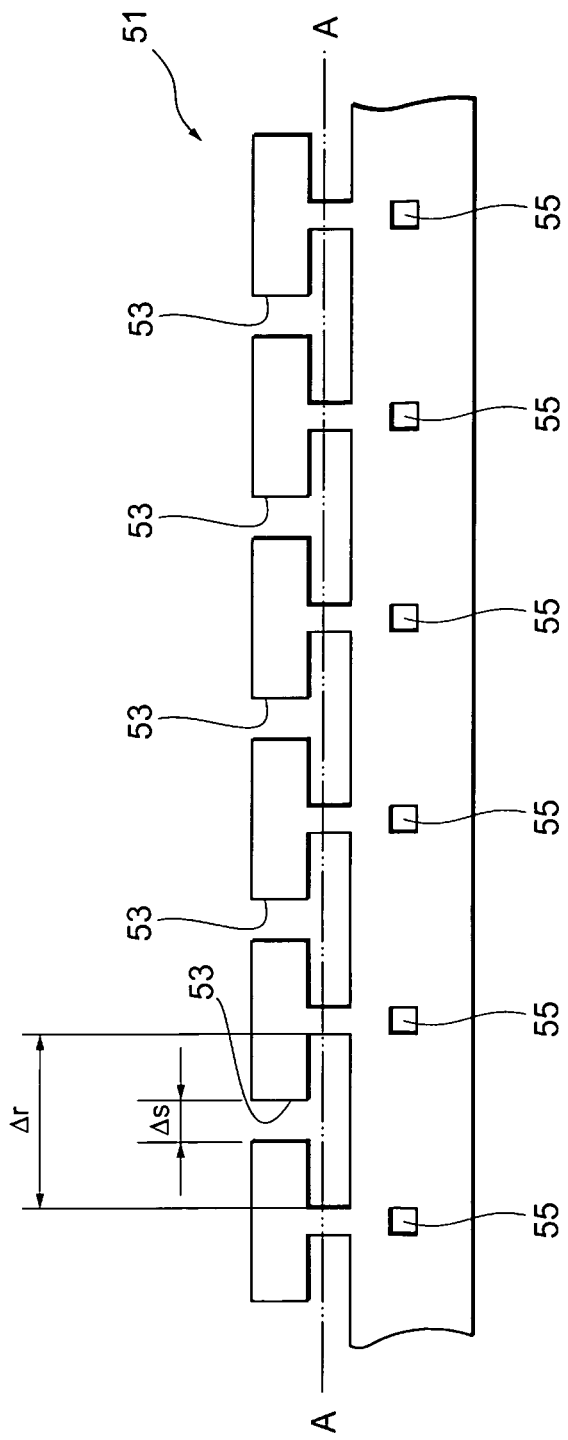
FIG. 27 is a plan view illustrating another modified embodiment of the plate-like integrated frame 51.

For example, as illustrated in FIG. 26 and FIG. 27, there may be a structure in which the shape of the concave portion 53 of the plate-like integrated frame 51 may spread inwardly from its opening continuously or stepwise, that is, a structure in which the width of the internal space Δr is wider than the width of the concave opening Δs.

With the above-mentioned configuration, the work board 100 can also be separated so as to separate the substrate 11 and the plate-like integrated frame 51 collectively in a separating plane that is a plane along a straight line (lines A-A in the figures) connecting wide width portions within a plurality of the concave portions 53, and thereby the worksheet 200 on which the cut pieces 51*a* of the plate-like integrated frame 51 are present at its outer periphery in a shape of frame can be easily produced, and the same operations and effects as those of the first embodiment can be obtained. Moreover, since the substantial separating area of the plate-like integrated frame 51 can be reduced further in the separating plane, separating will be facilitated and the lifetime of a separating tool can be extended by, for example, reduction of load on the edge of a dicer. Moreover, since formation of the holes 54 in the first embodiment can be omitted, a simple configuration and improvement of productivity can be achieved.

Moreover, for example, the surface (upper surface in FIG. 13) of the frame portion 52 of the plate-like integrated frame 51 may be roughened. When roughening is performed in this manner, adhesion with respect to the insulating layer 21 is improved, thereby, reduction of strength at the time of the handling due to lifting and peeling of the plate-like integrated frame 51, and dropping and scattering of the insulating layers 13 and 21 at the time of cutting-off can be reduced, contributing handling ability to be improved.

Further, as for the holes 54 and the holes 55 of the plate-like integrated frame 51, they may be formed as, for example, non-penetrated holes (hollows, concave portions), instead of penetrated holes.

Figure 28:
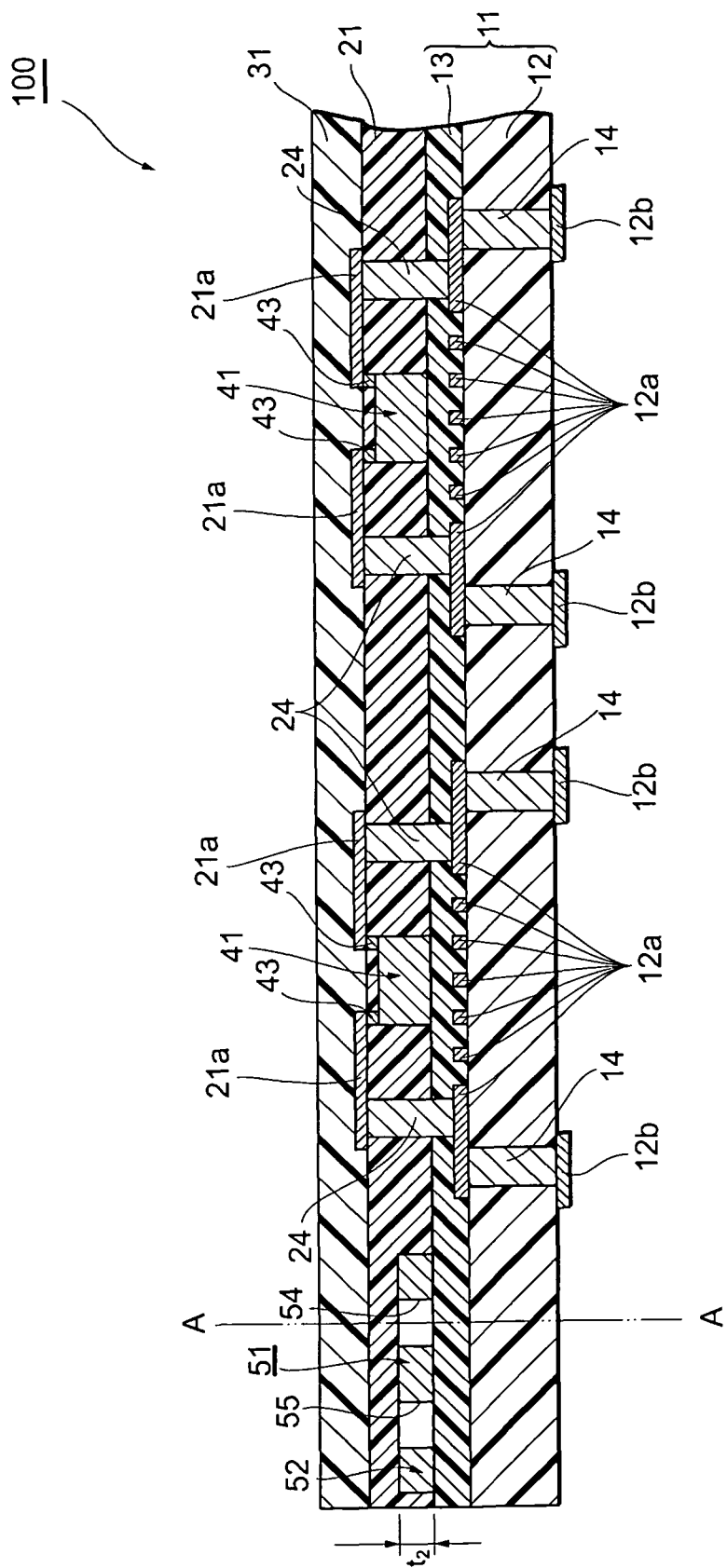
FIG. 28 is a main part cross-sectional view illustrating a modified embodiment of the work board 100.
Figure 29:
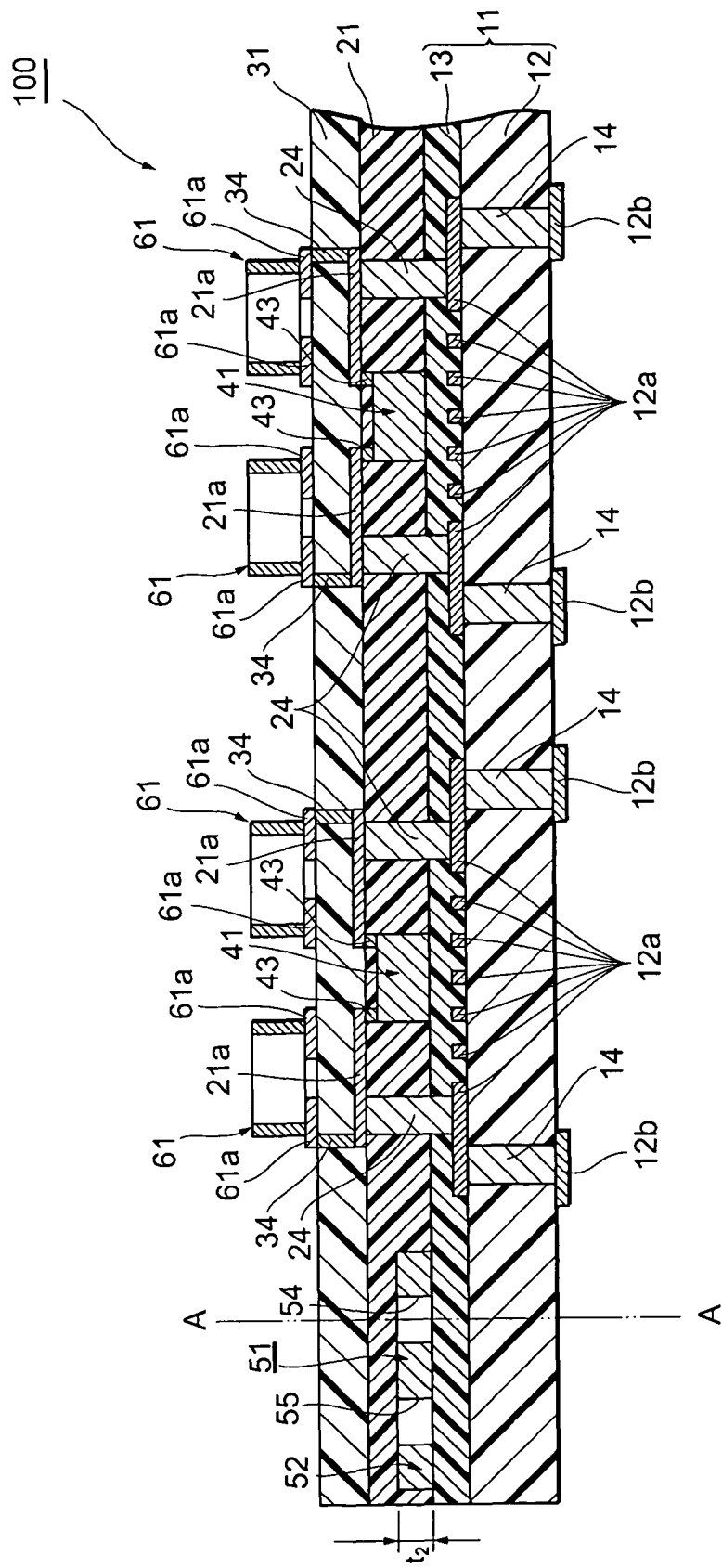
FIG. 29 is a main part cross-sectional view illustrating another modified embodiment of the work board 100.

At the same time, although in the first embodiment the work board 100 illustrated in FIG. 15 is separated at planes each of which is present along each of lines A-A illustrated in the figure, this separating of the work board 100 may be performed after steps of: protruding the bumps 43, forming the vias 24 and the wiring layer 21*a*, and forming the insulating layer 31. In FIG. 28 a main part cross-sectional view illustrating the schematic configuration of the work board 100 in this case is illustrated. Moreover, separating of the work board 100 may be performed after a step of surface mounting electronic components 61. In FIG. 29, a main part cross-sectional view illustrating the schematic configuration of the work board 100 in this case is illustrated.

Moreover, although, in the first embodiment, individual substrates 300 are produced by producing the electronic component-embedded module 201 by means of a process such as mounting electronic components on the worksheet 200, and by separating the electronic component-embedded module 201, the timing of mounting the electronic components is not particularly restricted and the electronic components may be mounted, for example, on a substrate in the state of the work board 100, or may be mounted on the individual substrates after they are obtained by separating the worksheet 200.

Moreover, although, in the first embodiment, the assembly substrate as the substrate 11 embedded with the electronic components 41 has been described, the present invention can be implemented effectively even in an assembly substrate not embedded with the electronic components 41. Further, the present invention can be implemented effectively regardless of whether the plate-like integrated frame 51 are located on the surfaces or the insides of the insulating layers 12, 13, 21, and 31. Moreover, the plate-like integrated frame 51 may be formed in a pattern-like shape.

In addition, although in the above-mentioned first embodiment and the modified embodiment, the assembly substrate and individual substrate embedded with semiconductor ICs as the electronic components 41 have been described, in place of and/or in addition to such a semiconductor IC, the present invention can be similarly implemented using a substrate embedded with an electronic component such as a varistor, a resistor, a capacitor, an inductor, a filter, an antenna, a transformer, and the like.

As mentioned above, the assembly substrate of the present invention and its manufacturing method enables substrate strength to be improved at low cost and with a simple configuration without requiring complicated processes. In turn, the occurrence of warpage can be effectively suppressed and productivity, economic efficiency and product reliability can be enhanced. As a result, contributions can be made towards further thinning when modularizing the electronic component, and the present invention may be widely and efficiently utilized in electronic devices, apparatuses, systems, various devices and the like embedded with a thinned electronic component, particularly in those requiring downsizing, thinning and higher performance as well as in the manufacturing of the same.

What is claimed is:

1. An assembly substrate which contains a plurality of individual substrates in a surface direction of the assembly substrate, comprising:
    a base substrate, the base substrate having product areas and non-product areas, the individual substrates being formed in the product areas, the non-product areas surrounding and dividing the product areas in plan view;
    wiring layers formed in correspondence to the individual substrates respectively; and
    a frame body which is arranged, with respect to a plurality of assembly bodies each containing at least one or more of the individual substrates, so as to surround an outer periphery of the respective assembly bodies, and which has an inner periphery and a plurality of concave portions arranged in parallel along the inner periphery, the frame body being embedded between two insulating layers and being arranged only in the non-product areas,
    wherein the frame body is a lattice frame having a plurality of windows each having an inner periphery, and the plurality of concave portions are provided at the inner periphery of each of the windows, and
    the frame body has holes, each hole being between two neighboring concave portions and being on a straight line connecting the two neighboring concave portions.

2. The assembly substrate according to claim 1, wherein each concave portion has an opening and spreads inwardly from the opening.

3. The assembly substrate according to claim 1, the frame body being mechanically connected but not electrically connected to the individual substrates.

4. A method of manufacturing an assembly substrate which contains a plurality of individual substrates in a surface direction of the assembly substrate, comprising:
    a step of preparing a base substrate which has wiring layers formed in correspondence to the individual substrates respectively, the base substrate having product areas and non-product areas, the individual substrate being formed in the product areas, the non-product areas surrounding and dividing the product areas in plan view; and
    a step of arranging, with respect to a plurality of assembly bodies containing at least one or more of the individual substrates, a frame body which has a plurality of concave portions arranged in parallel along an inner periphery of the frame body, so as to surround an outer periphery of the respective assembly bodies, the frame body being embedded between two insulating layers and being arranged only in the non-product areas,
    wherein the frame body is a lattice frame having a plurality of windows each having an inner periphery, and the plurality of concave portions are provided at the inner periphery of each of the windows, and
    the frame body has holes, each hole being between two neighboring concave portions and being on a straight line connecting the two neighboring concave portions.

5. The method according to claim 4, the frame body being mechanically connected but not electrically connected to the individual substrates.

* * * * *